(12) United States Patent
Choi et al.

(10) Patent No.: US 10,979,150 B2
(45) Date of Patent: Apr. 13, 2021

(54) METHOD OF TESTING RF INTEGRATED CIRCUIT

(71) Applicant: SAMSUNG ELECTRONICS CO., LTD., Suwon-si (KR)

(72) Inventors: Dooseok Choi, Hwaseong-si (KR); Dae-young Yoon, Yongin-si (KR); Sun-woo Lee, Suncheon-si (KR); Thomas Byunghak Cho, Seongnam-si (KR); Seung-chan Heo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 123 days.

(21) Appl. No.: 16/356,088

(22) Filed: Mar. 18, 2019

(65) Prior Publication Data
US 2019/0319717 A1 Oct. 17, 2019

(30) Foreign Application Priority Data

Apr. 16, 2018 (KR) .................. 10-2018-0044117
Aug. 20, 2018 (KR) .................. 10-2018-0096820

(51) Int. Cl.
*G01R 29/08* (2006.01)
*H04B 17/00* (2015.01)
(Continued)

(52) U.S. Cl.
CPC ..... *H04B 17/0082* (2013.01); *G01R 29/0892* (2013.01); *H03F 3/245* (2013.01);
(Continued)

(58) Field of Classification Search
CPC ............ H04B 17/0082; H04B 17/0085; H04B 17/14; H04B 17/44; H04B 17/00; G01R 29/0892; H03F 3/245
See application file for complete search history.

(56) References Cited

U.S. PATENT DOCUMENTS 3,937,882 A * 2/1976 Bingham ................ H04L 5/143
                                                                370/276
6,397,042 B1 * 5/2002 Prentice ................. H04L 1/243
                                                                375/355
(Continued)

FOREIGN PATENT DOCUMENTS

JP          3395144 B2     4/2003

OTHER PUBLICATIONS

Communication dated Sep. 3, 2019, from the European Patent Office in counterpart European Application No. 19160571.6.

*Primary Examiner* — Patrick Assouad
*Assistant Examiner* — Demetrius R Pretlow
(74) *Attorney, Agent, or Firm* — Sughrue Mion, PLLC

(57) ABSTRACT

A method of testing a radio frequency (RF) integrated circuit includes: forming, performed by the RF integrated circuit, a test loop that passes through a first transceiver circuit, a first front-end circuit, and a second transceiver circuit, based on a test control signal transmitted from a test device; adjusting, performed by the RF integrated circuit, a shift degree of at least one phase shifter in the first front-end circuit, based on the test control circuit; and receiving, performed by the RF integrated circuit, a test input signal via the first transceiver circuit from the test device, and outputting, to the test device, the test input signal that has passed through the test loop, wherein the test input signal is output as a test output signal via the second transceiver circuit.

19 Claims, 21 Drawing Sheets

(51) Int. Cl.
*H03F 3/24* (2006.01)
*H04B 1/44* (2006.01)

(52) U.S. Cl.
CPC ......... *H04B 1/44* (2013.01); *H03F 2200/294* (2013.01); *H03F 2200/451* (2013.01)

(56) References Cited

U.S. PATENT DOCUMENTS

| | | | |
|---|---|---|---|
| 7,110,794 B1* | 9/2006 | Iinuma | H01Q 3/2605 455/562.1 |
| 7,200,170 B1 | 4/2007 | Desandoli et al. | |
| 7,983,112 B2 | 7/2011 | Haraguchi et al. | |
| 8,000,382 B2 | 8/2011 | Inanoglu et al. | |
| 8,532,226 B2 | 9/2013 | Wambacq | |
| 8,917,761 B2 | 12/2014 | Huynh | |
| 9,140,750 B2 | 9/2015 | Pausini et al. | |
| 9,214,726 B2 | 12/2015 | Aydin et al. | |
| 9,383,433 B2 | 7/2016 | Doyle | |
| 9,667,282 B1* | 5/2017 | Merlin | H04B 1/04 |
| 9,692,402 B2 | 6/2017 | Wagh et al. | |
| 9,866,294 B1 | 1/2018 | Bartko | |
| 9,871,602 B2 | 1/2018 | Feldman et al. | |
| 9,923,269 B1 | 3/2018 | Hageman et al. | |
| 2004/0048584 A1* | 3/2004 | Vaidyanathan | H04B 1/0475 455/103 |
| 2005/0047495 A1* | 3/2005 | Yoshioka | G01R 31/31716 375/219 |
| 2007/0058702 A1* | 3/2007 | Zhang | H04L 27/364 375/219 |
| 2007/0243826 A1 | 10/2007 | Liu | |
| 2011/0116558 A1 | 5/2011 | Otaka et al. | |
| 2014/0256376 A1 | 9/2014 | Weissman et al. | |
| 2015/0079912 A1* | 3/2015 | Dehos | H04B 1/408 455/76 |
| 2015/0139352 A1* | 5/2015 | Matsuo | H01Q 3/267 375/295 |
| 2015/0195725 A1* | 7/2015 | Janbu | G01S 5/0205 455/67.16 |
| 2016/0087764 A1* | 3/2016 | Tsuchiya | H04L 1/243 375/295 |
| 2016/0308626 A1 | 10/2016 | Mow et al. | |
| 2017/0090015 A1* | 3/2017 | Breen | G01S 7/032 |
| 2017/0307669 A1 | 10/2017 | Forstner et al. | |
| 2018/0048398 A1 | 2/2018 | El-Hassan | |
| 2018/0131453 A1* | 5/2018 | Sharma | H04B 17/14 |
| 2019/0319722 A1* | 10/2019 | Yu | H04B 17/21 |
| 2019/0363744 A1* | 11/2019 | Oshima | H04B 7/0617 |
| 2019/0372218 A1* | 12/2019 | Vehovc | H01Q 3/34 |
| 2020/0091608 A1* | 3/2020 | Alpman | H01Q 1/38 |

* cited by examiner

METHOD OF TESTING RF INTEGRATED CIRCUIT

CROSS-REFERENCE TO THE RELATED APPLICATIONS

This application claims priority from Korean Patent Application Nos. 10-2018-0044117, filed on Apr. 16, 2018, and 10-2018-0096820, filed on Aug. 20, 2018 in the Korean Intellectual Property Office, the disclosures of which are incorporated herein in their entirety by reference.

BACKGROUND

Apparatuses and methods consistent with exemplary embodiments of the inventive concept relate to testing a radio frequency (RF) integrated circuit for determining defects occurring in a process of mass production of the RF integrated circuit.

Unlike a low-frequency band in the related art wireless communication technologies (e.g., third generation (3G) or fourth generation (4G)), signal attenuation in a millimeter-wave frequency band (or radio frequency band) has a significant impact on communication performance, and thus, there is a difficulty in realizing communication using millimeter waves (e.g., fifth generation (5G)). In order to compensate for signal attenuation, research has been conducted for an RF integrated circuit using a high transmission power and maximizing an antenna gain in a millimeter wave communication.

Meanwhile, in a characteristic evaluation environment for mass-production of the RF integrated circuit of a low frequency band according to the related art, whether the RF integrated circuit is normal or defective is tested according to a magnitude of a signal transmitting through the RF integrated circuit by using a test device (e.g., a signal generator and a signal receiver). This test method is used for testing as many RF integrated circuit products as possible within a short period of time. However, since it is difficult to test a phase shifter that is a main element of the RF integrated circuit supporting millimeter-wave communication by using the related art test device, a method of using a vector network analyzer has been suggested as a way of performing the above test. However, since the vector network analyzer is a very expensive device and is specialized for use in a design and development environment, it is difficult to use the vector network analyzer in a process of mass-production of the RF integrated circuit, and thus, research on a method of testing characteristics of the RF integrated circuit by using existing test devices for mass-production is being conducted.

SUMMARY

Exemplary embodiments of the inventive concept provide a method of testing an RF integrated circuit, the method being capable of effectively evaluating characteristics of an RF integrated circuit by testing a phase shifter of the RF integrated circuit in a process of mass-production of the RF integrated circuit that supports millimeter-wave communication.

According to an exemplary embodiment, there is provided a method of testing an RF integrated circuit which includes a first front-end circuit including a plurality of switching devices for connecting to a first antenna array, a second front-end circuit including a plurality of switching devices for connecting to a second antenna array, a first transceiver circuit connected to the first front-end circuit to transmit/receive signals, a second transceiver circuit connected to the second front-end circuit to transmit/receive signals, and a switching circuit configured to selectively connect the first and second front-end circuits to the first and second transceiver circuits. The method may include: forming, performed by the RF integrated circuit, a test loop that passes through the first transceiver circuit, the first front-end circuit, and the second transceiver circuit, based on a test control signal transmitted from a test device; adjusting, performed by the RF integrated circuit, a shift degree of at least one phase shifter in the first front-end circuit, based on the test control signal; receiving, performed by the RF integrated circuit, a test input signal via the first transceiver circuit from the test device, and outputting, to the test device, the test input signal that has passed through the test loop, wherein the test input signal is output as a test output signal via the second transceiver circuit; and evaluating, performed by the test device, characteristics of the at least one phase shifter based on the test output signal.

According to an exemplary embodiment, there is provided a method of testing an RF integrated circuit which includes a front-end circuit including a plurality of transmission/reception chains. The method may include: forming, performed by the RF integrated circuit, a test loop in at least two transmission/reception chains selected from among the plurality of transmission/reception chains, based on a test control signal received from a test device; adjusting, performed by the RF integrated circuit, a shift degree of at least one phase shifter included in the selected transmission/reception chains based on the test control signal; receiving, performed by the RF integrated circuit, a test input signal from the test device, and outputting, to the test device, the test input signal, that has passed through the test loop, as a test output signal; and evaluating, performed by the test device, characteristics of the at least one phase shifter based on the test output signal.

According to an exemplary embodiment, there is provided a method of testing an RF integrated circuit which may include performing a test loop operation a plurality of times by using a test loop that passes through a first transceiver circuit, a first front-end circuit, and a second transceiver circuit in the RF integrated circuit, wherein the test loop operation includes: receiving, performed by the RF integrated circuit, an n-th phase control signal from a test device and adjusting a shift degree of at least one phase shifter in the first front-end circuit to an n-th state; and receiving, performed by the RF integrated circuit, a test input signal from the test device via the first transceiver circuit, and outputting, to the test device, the test input signal that has passed through the test loop, wherein the test input signal is output as an n-th test output signal via the second transceiver circuit, wherein the test device determines whether the at least one phase shifter is defective by using magnitudes of a plurality of test output signals including the n-th test output signal collected as results of the test loop operation performed a plurality of times. Here, n is an integer greater than zero

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Hereinafter, exemplary embodiments of the inventive concept will be described in detail with reference to accompanying drawings. Since these embodiments are all exemplary, and do not limit the inventive concept.

Figure 1:
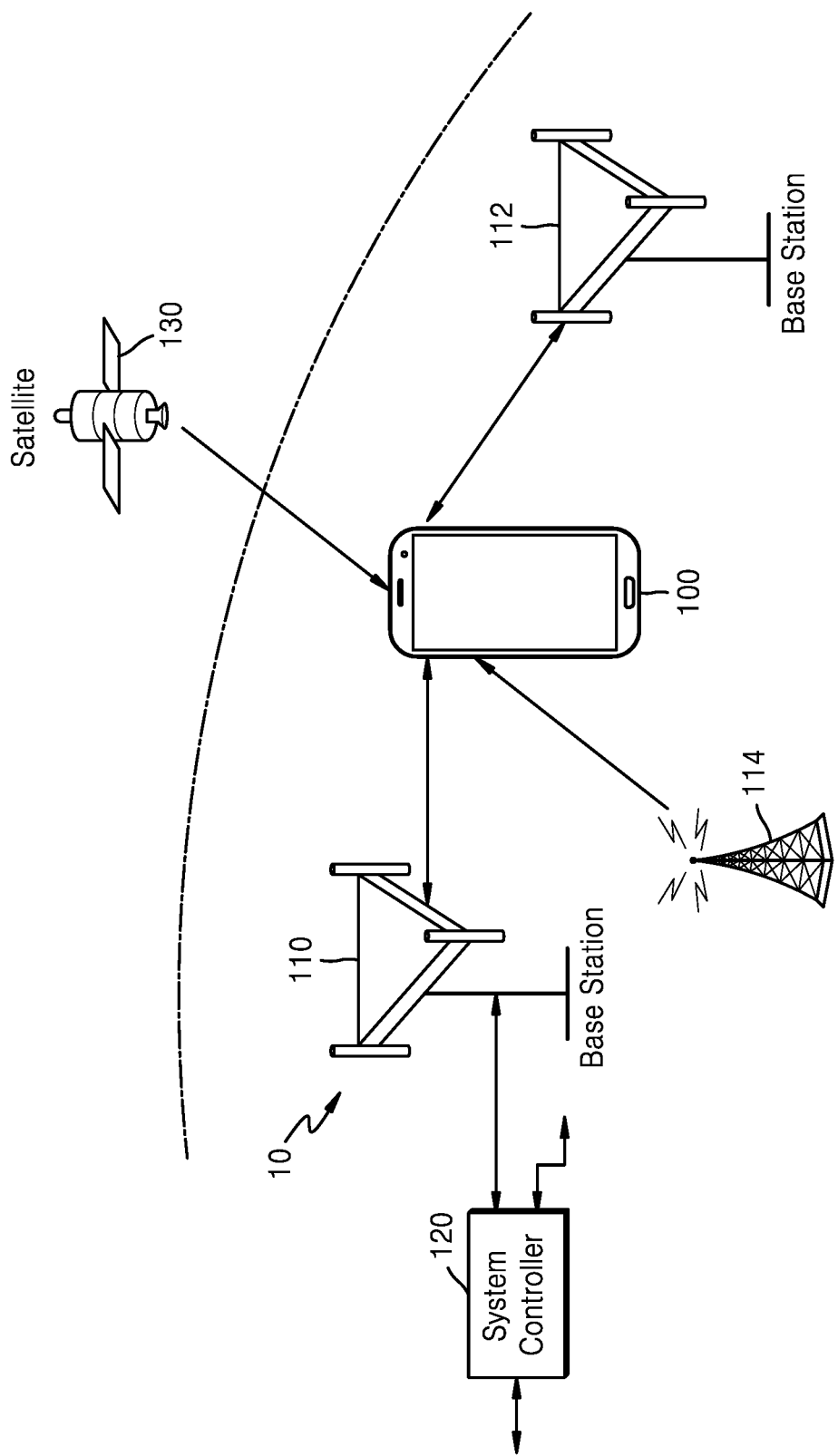
FIG. 1 is a diagram of a wireless communication device performing wireless communication and a wireless communication system including the wireless communication device.

FIG. 1 is a diagram of a wireless communication device 100 performing a wireless communication and a wireless communication system 10 including the wireless communication device.

Referring to FIG. 1, the wireless communication system 10 may be one of a long term evolution (LTE) system, a code division multiple (CDMA) system, a global system for mobile communication (GSM) system, and a wireless local area network (WLAN) system. Also, a CDMA system may be implemented in various CDMA versions, e.g., a wide-band CDMA (WCDMA), a time-division synchronized CDMA (TD-SCDMA), CDMA2000, etc.

The wireless communication system 10 may include at least two base stations 110 and 112, and a system controller 120. However, the wireless communication system 10 may include more than two base stations and a plurality of network entities. The wireless communication device 100 may be referred to as a user equipment (UE), a mobile station (MS), a mobile terminal (MT), a user terminal (UT), a subscribe station (SS), a portable device, etc. The base stations 110 and 112 may denote fixed stations that communicate with the wireless communication device 100 and/or other base stations, and may communicate with the wireless communication device 100 and/or other base stations to transmit and receive a radio frequency (RF) signal including data signals and/or control information. The base stations 110 and 112 may be respectively referred to as a node B, an evolved-Node B (eNB), a base transceiver system (BTS), an access point (AP), etc.

The wireless communication device 100 may communicate with the wireless communication system 10, and may receive signals from a broadcast station 114. Moreover, the wireless communication device 100 may receive signals from a satellite 130 of a global navigation satellite system (GNSS). The wireless communication device 100 may support a radio technique for performing wireless communication (for example, 5th generation (5G), LTE, cdma2000, WCDMA, TD-SCDMA, GSM, 802.11, etc.).

In particular, the wireless communication device 100 may support millimeter wave (mm-Wave) wireless communication technique, and may transfer a large amount of multimedia information by using a bandwidth of 1 GHz or greater via a superhigh frequency of 30 to 300 GHz and controlling a short wavelength in units of millimeter (mm). An RF integrated circuit of the wireless communication device 100 may pass a characteristic evaluation test in a mm-Wave band before or after being connected to an antenna in a mass-production process.

As an embodiment, a test loop for the characteristic evaluation test is formed in the RF integrated circuit of the wireless communication device 100, and a test input signal input to the RF integrated circuit may pass through the test loop, and may be output to a test device as a test output signal. The test loop may pass through a plurality of phase shifters included in the RF integrated circuit for supporting a multi-antenna technique, and the test device may check a variation in a magnitude of the test output signal while adjusting a shift degree of at least one target phase shifter from among the plurality of phase shifters in the RF integrated circuit, and may evaluate characteristics of the RF integrated circuit (in detail, the phase shifters in the RF integrated circuit) based on a checking result during the characteristic evaluation test.

As an embodiment, a plurality of transmission paths or a plurality of reception paths for performing the characteristic evaluation test are formed in the RF integrated circuit of the wireless communication device 100, and a test input signal input to the RF integrated circuit may pass through the transmission paths and may be transmitted to the test device as a test output signal via an antenna array connected to the RF integrated circuit, or a test input signal received by the RF integrated circuit via the antenna array may pass through the reception paths and may be output to the test device as a test output signal. The transmission paths or the reception paths may pass through a plurality of phase shifters included in the RF integrated circuit for supporting a multi-antenna technique. The test device may check a variation in a magnitude of the test output signal while adjusting a shift degree of at least one target phase shifter from among the phase shifters in the RF integrated circuit, and, based on a checking result, may evaluate characteristics of the RF integrated circuit (in detail, the phase shifters in the RF integrated circuit), and radiation characteristics and reception characteristics of the antenna array (or antenna module) connected to the RF integrated circuit.

As described above, whether the RF integrated circuits are normal or defective may be easily and rapidly determined through the characteristic evaluation test performed on the RF integrated circuit of the wireless communication device 100 according to the embodiment, and thus, mass-production of the RF integrated circuits in the mm-Wave band and the antenna arrays (or antenna module) connected to the RF integrated circuit may be effectively performed.

Figure 2:
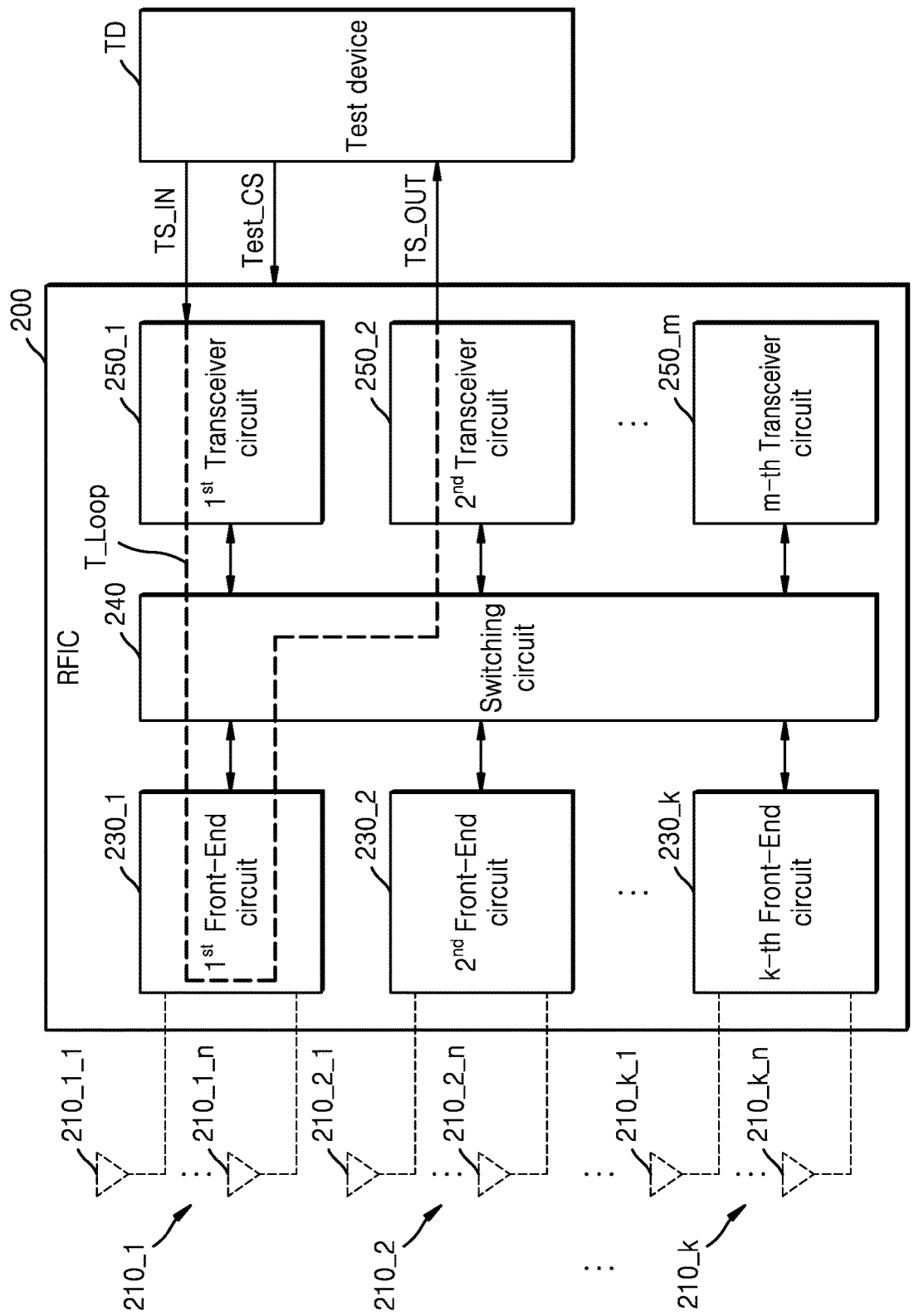
FIG. 2 is a block diagram for describing an RF integrated circuit on which a characteristic evaluation test according to an embodiment is performed.

FIG. 2 is a block diagram for describing an RF integrated circuit 200 on which a characteristic evaluation test according to an embodiment is performed.

Referring to FIG. 2, the RF integrated circuit 200 may include a plurality of first to k-th front-end circuits 230_1 to 230_k, a switching circuit 240, and a plurality of first to m-th transceiver circuits 250_1 to 250_m. The first to k-th front-end circuits 230_1 to 230_k may be directly connected to a plurality of first to k-th antenna arrays 210_1 to 210_k respectively, and the antenna arrays 210_1 to 210_k may respectively include a plurality of antennas 210_1_1 to 210_1_n, 210_2_1 to 210_2_n, . . . , 210_k_1 to 210_k_n. The first to k-th front-end circuits 230_1 to 230_k may include a plurality of phase shifters for supporting multi-antenna technique. In detail, a plurality of paths for transmitting/receiving an RF signal in the first to k-th front-end circuits 230_1 to 230_k may each pass through a phase shifter. However, the first to k-th front-end circuits 230_1 to 230_k are assumed to be in a state where the antenna arrays 210_1 to 210_k are not connected to the first to k-th front-end circuits 230_1 to 230_k when the characteristic evaluation test using a test loop T_Loop of the RF integrated circuit 200 is performed, and accordingly, the antenna arrays 210_1 to 210_k are indicated by dashed lines in FIG. 2. Also, the characteristic evaluation test on the RF integrated circuit 200 may include characteristic evaluation tests on the plurality of first to k-th front-end circuits 230_1 to 230_k. The characteristic evaluation tests on the first to k-th front-end circuits 230_1 to 230_k may include characteristic evaluation tests performed on a plurality of phase shifters in each of the first to k-th front-end circuits 230_1 to 230_k. In the above, k, m, and n are each an integer which is greater than or equal to 2.

The transceiver circuits 250_1 to 250_m may be exclusively dedicated to at least one of the front-end circuits 230_1 to 230_k. For example, when a first transceiver circuit 250_1 is dedicated to a first front-end circuit 230_1, the first transceiver circuit 250_1 may transmit/receive a communication signal via the first front-end circuit 230_1. Hereinafter, descriptions will be provided under an assumption in which the first transceiver circuit 250_1 is dedicated to the first front-end circuit 230_1 and a second transceiver circuit 250_2 is dedicated to a second front-end circuit 230_2.

The switching circuit 240 may perform selective connecting operations between the first to k-th front-end circuits 230_1 to 230_k and the first to m-th transceiver circuits 250_1 to 250_m when the characteristic evaluation test is performed on the RF integrated circuit or a communication operation is performed. Also, the switching circuit 240 may include a connection circuit for selectively connecting two transceiver circuits, through which the test loop T_Loop passes, from among the transceiver circuits 250_1 to 250_m, during the characteristic evaluation test performed on the RF integrated circuit 200. A test input signal TS_IN that has passed through the test loop T_Loop may be output to a test device TD as a test output signal TS_OUT via the second transceiver circuit 250_2, according to the structure of the connection circuit in the switching circuit 240.

The RF integrated circuit 200 according to the embodiment may receive a test control signal Test_CS from the test device TD, and may form the test loop T_Loop in the RF integrated circuit 200 in response to the test control signal Test_CS. As an example, the test loop T_Loop is formed to evaluate characteristics of the phase shifters in the first front-end circuit 230_1, and the test loop T_Loop may be configured to pass through the first transceiver circuit 250_1, the first front-end circuit 230_1, and the second transceiver circuit 250_2. However, the inventive concept is not limited to the above example, and the test loop T_Loop may be variously modified so as to evaluate characteristics of the phase shifters in the other front-end circuits 230_2 to 230_k based on the test control signal Test_CS. As an example, when the test loop T_Loop is formed to evaluate characteristics of the phase shifters in the second front-end circuit 230_2, and the test loop T_Loop may be configured to pass through the second transceiver circuit 250_2, the second front-end circuit 230_2, and the first transceiver circuit 250_1.

At least one target phase shifter is selected from among the phase shifters in the first front-end circuit 230_1 based on the test control signal Test_CS, and a shift degree of the target phase shifter may be adjusted, and shift degrees of other phase shifters except for the target phase shifter may be fixed. Whenever the shift degree of the target phase shifter is adjusted, the test device TD may provide the first transceiver circuit 250_1 with a test input signal TS_IN of a baseband or an intermediate frequency band, and the test input signal TS_IN passes through the test loop T_Loop and then may be output to the test device TD as a test output signal TS_OUT via the second transceiver circuit 250_2.

The test device TD evaluates the characteristics of the target phase shifter and determines whether the target phase shifter is defective, based on magnitudes of a plurality of test output signals TS_OUT that are obtained according to the adjustment of the shift degree of the target phase shifter.

When the characteristic evaluation test on the target phase shifter in the first front-end circuit 230_1 is finished, a next target phase shifter is selected in the first front-end circuit 230_1 based on the test control signal Test_CS, and then, the above characteristic evaluation test may be repeatedly performed. In the above manner, the test device TD may perform the characteristic evaluation tests on the phase shifters in the first front-end circuit 230_1, and may determine whether the first front-end circuit 230_1 is defective based on test results.

When the characteristic evaluation test on the first front-end circuit 230_1 is finished, the test device TD may perform the characteristic evaluation test on the second front-end circuit 230_2. In the above manner, the test device TD may perform the characteristic evaluation tests on all of the first to k-th front-end circuits 230_1 to 230_k, and may determine whether the RF integrated circuit 200 is defective based on the test results. As an embodiment, the test device TD may determine that the RF integrated circuit 200 is defective when the front-end circuits of a predetermined number or greater are defective from among the first to k-th front-end circuits 230_1 to 230_k.

Also, as an embodiment, the test device TD may selectively perform the characteristic evaluation tests on some of the first to k-th front-end circuits 230_1 to 230_k, and moreover, may selectively perform the characteristic evaluation tests only on some phase shifters in at least one of the first to k-th front-end circuits 230_1 to 230_k.

Figure 3:
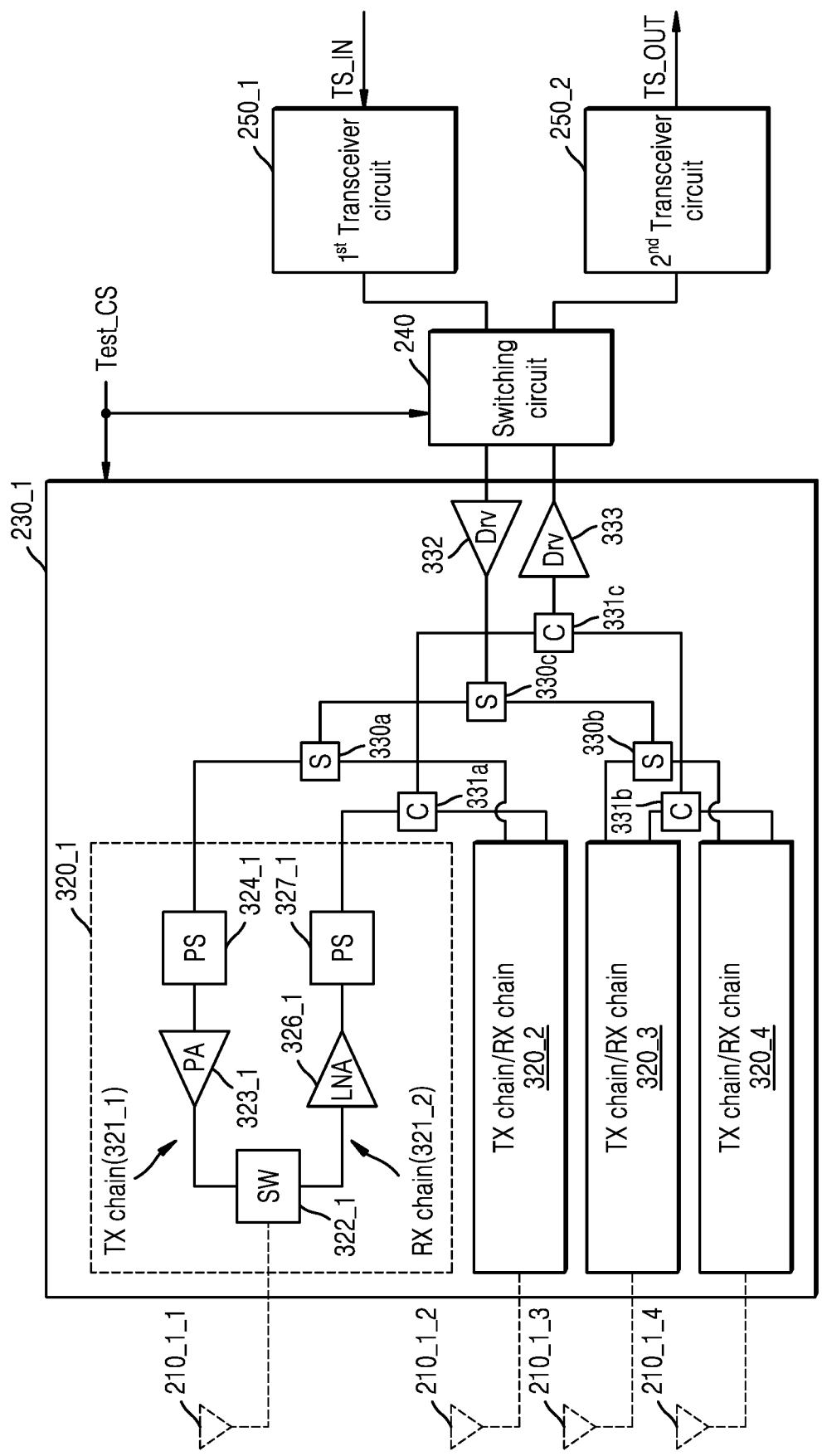
FIG. 3 is a block diagram for describing a first front-end circuit of FIG. 2 on which a characteristic evaluation test according to an embodiment is performed.

FIG. 3 is a block diagram for describing the first front-end circuit 230_1 of FIG. 2 on which a characteristic evaluation test according to an embodiment is performed.

Referring to FIG. 3, the first front-end circuit 230_1 may include a plurality of first to fourth transmission/reception chains 320_1 to 320_4, a plurality of first to third splitters 330a to 330c, a plurality of first to third combiners 331a to 331c, and a plurality of drivers such as first and second drivers 332 and 333. A first transmission/reception chain 320_1 includes a transmission chain 321_1 and a reception chain 321_2, and the transmission chain 321_1 and the reception chain 322_1 may each be connected to a first antenna 210_1_1 via a switching device 322_1. The transmission chain 321_1 includes a power amplifier 323_1 and a phase shifter 324_1, and the reception chain 321_2 may include a low-noise amplifier 326_1 and a phase shifter 327_1. The transmission chain 321_1 may be referred to as a transmission line and the reception chain 321_2 may be referred to as a reception line. A structure of the first transmission/reception chain 320_1 may be applied to other transmission/reception chains 320_2 to 320_4. Antennas 210_1_1 to 210_1_4 connected respectively to the first to fourth transmission/reception chains 320_1 to 320_4 may be referred to as an antenna array.

The transmission chain 321_1 of the first transmission/reception chain 320_1 and a transmission chain of the second transmission/reception chain 320_2 may be connected to a first splitter 330a, and a transmission chain of the third transmission/reception chain 320_3 and a transmission chain of the fourth transmission/reception chain 320_4 may be connected to a second splitter 330b. The first splitter 330a and the second splitter 330b may be connected to a third splitter 330c. The third splitter 330c may separate a transmission signal output from a first driver 332 and provides the transmission signal to the first splitter 330a and the second splitter 330b, the first splitter 330a separates the separated transmission signal once again to provide the transmission signal to the first transmission/reception chain 320_1 and the second transmission/reception chain 320_2, and the second splitter 330b separates the separated transmission signal once again to provide the transmission signal to the third transmission/reception chain 320_3 and the fourth transmission/reception chain 320_4.

The reception chain 321_2 of the first transmission/reception chain 320_1 and a reception chain of the second transmission/reception chain 320_2 are connected to a first combiner 331a, and a reception chain of the third transmission/reception chain 320_3 and a reception chain of the fourth transmission/reception chain 320_4 may be connected to a second combiner 331b. The first combiner 331a and the second combiner 331b may be connected to a third combiner 331c. The first combiner 331a combines reception signals received from the first transmission/reception chain 320_1 and the second transmission/reception chain 320_2 and provides the combined signal to the third combiner 331c, and the second combiner 331b combines reception signals received from the third transmission/reception chain 320_3 and the fourth transmission/reception chain 320_4 and provides the combined signal to the third combiner 331c. The third combiner 331c may combine the reception signals received from the first and second combiners 331a and 331b and output the combined signal to a second driver 333.

The first front-end circuit 230_1 and the switching circuit 240 receive the test control signal Test_CS, and may form a test loop in response to the test control signal Test_CS. In detail, switching of the switching devices in the transmission/reception chains 320_1 to 320_4 (e.g., a switching device 322_1 connected between the transmission chain 321_1 and the reception chain 321_2 of the first transmission/reception chain 320_1) is controlled based on the test control signal Test_CS, and the first transceiver circuit 250_1 and the second transceiver circuit 250_2 are connected via the switching circuit 240, switching of which is controlled based on the test control signal Test_CS, thereby forming the test loop. That is, the test loop may include test sub-loops respectively formed in at least two transmission/reception chains from among the plurality of first to fourth transmission/reception chains 320_1 to 320_4 in the first front-end circuit 230_1. Hereinafter, the transmission/reception chain through which the test loop passes may be referred to as a selected transmission/reception chain. In addition, although not shown in FIG. 3, the first transceiver circuits 250_1 and the second transceiver circuit 250_2 may also receive the test control signal Test_CS for forming the test loop, and a switching device included in each of the first and second transceiver circuits 250_1 and 250_2 may be controlled in response to the test control signal Test_CS.

The shift degree of at least one target phase shifter from among the phase shifters in the first to fourth transmission/reception chains 320_1 to 320_4 may be adjusted based on the test control signal Test_CS. As an example, the shift degree of at least one target phase shifter from among the phase shifters, through which the test loop passes, may be adjusted based on the test control signal Test_CS. The shift degree of the target phase shifter may be adjusted by a predetermined unit amount, and the predetermined unit amount may vary depending on a mode of the characteristic evaluation test (e.g., a fine mode or a rough mode) or multi-antenna communication technology specification that may be supported by the RF integrated circuit including the first front-end circuit 230_1. The target phase shifter may be included in a transmission chain (e.g., the transmission chain 321_1 of the first transmission/reception chain 320_1) or a reception chain (e.g., the reception chain 321_2 of the first transmission/reception chain 320_1). The shift degrees of other phase shifters than the target phase shifter, from among the phase shifters in the first to fourth transmission/reception chains 320_1 to 320_4, may be fixed (or maintained) as a predetermined value. After that, the test input signal TS_IN is input to the first transceiver circuit 250_1 to pass through the test loop, and then, may be output as a test output signal TS_OUT via the second transceiver circuit 250_2. In the above manner, the shift degree of the target phase shifter may be adjusted to output a plurality of test output signals TS_OUT having different magnitudes from one another.

The configuration of the first front-end circuit 230_1 may be applied to other front-end circuits 230_2 to 230_k in FIG. 2, and the embodiment of the characteristic evaluation test performed on the first front-end circuit 230_1 may be applied to characteristic evaluation tests that are to be performed on the other front-end circuits 230_2 to 230_k.

In FIG. 3, the first front-end circuit 230_1 includes four first to fourth transmission/reception chains 320_1 to 320_4, but the inventive concept is not limited thereto, and more or less transmission/reception chains than four transmission/reception chains may be included in the first front-end circuit 230_1.

Figure 4A:
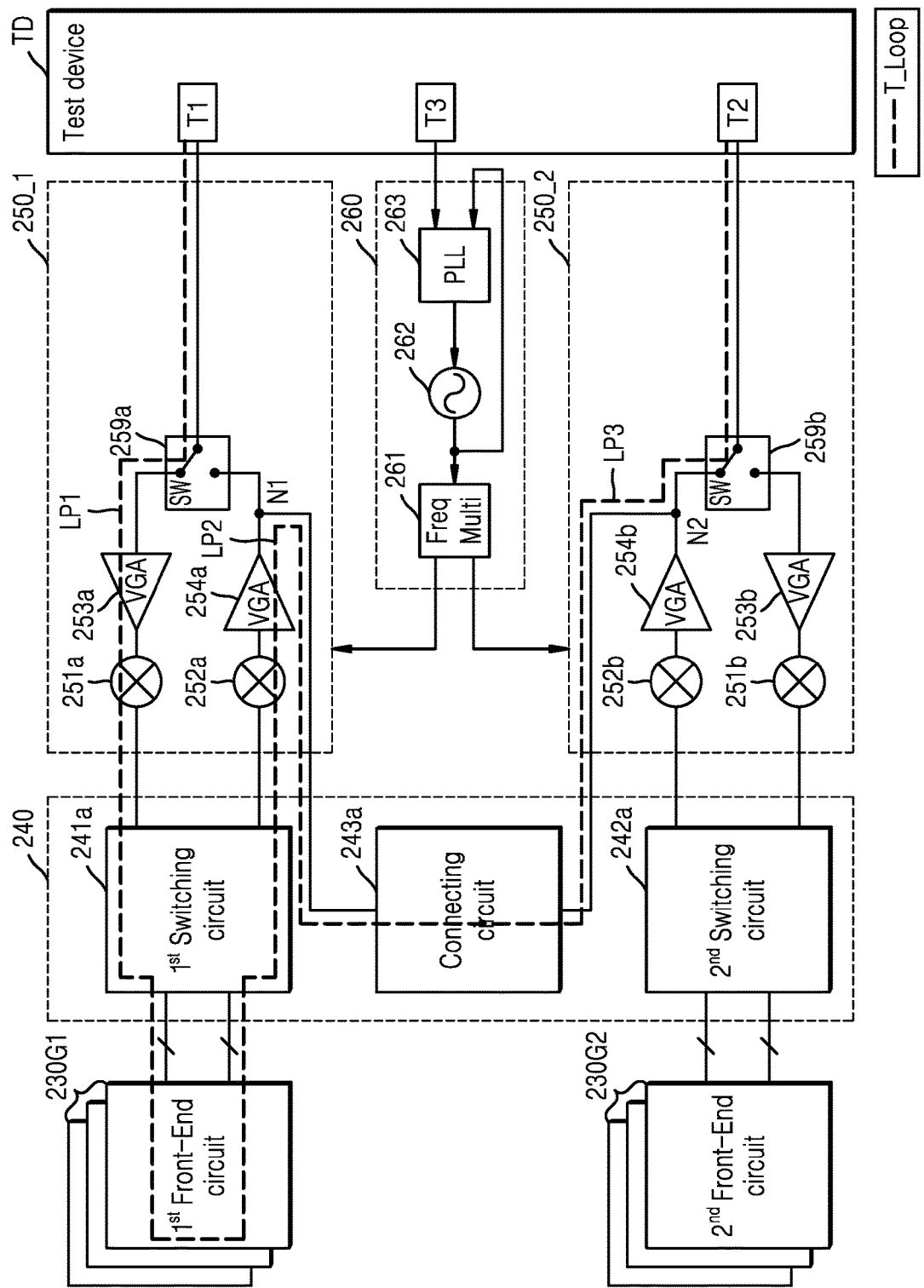
FIGS. 4A to 4C are block diagrams for describing a switching circuit and transceiver circuits on which a characteristic evaluation test according to an embodiment is performed.
Figure 4B:
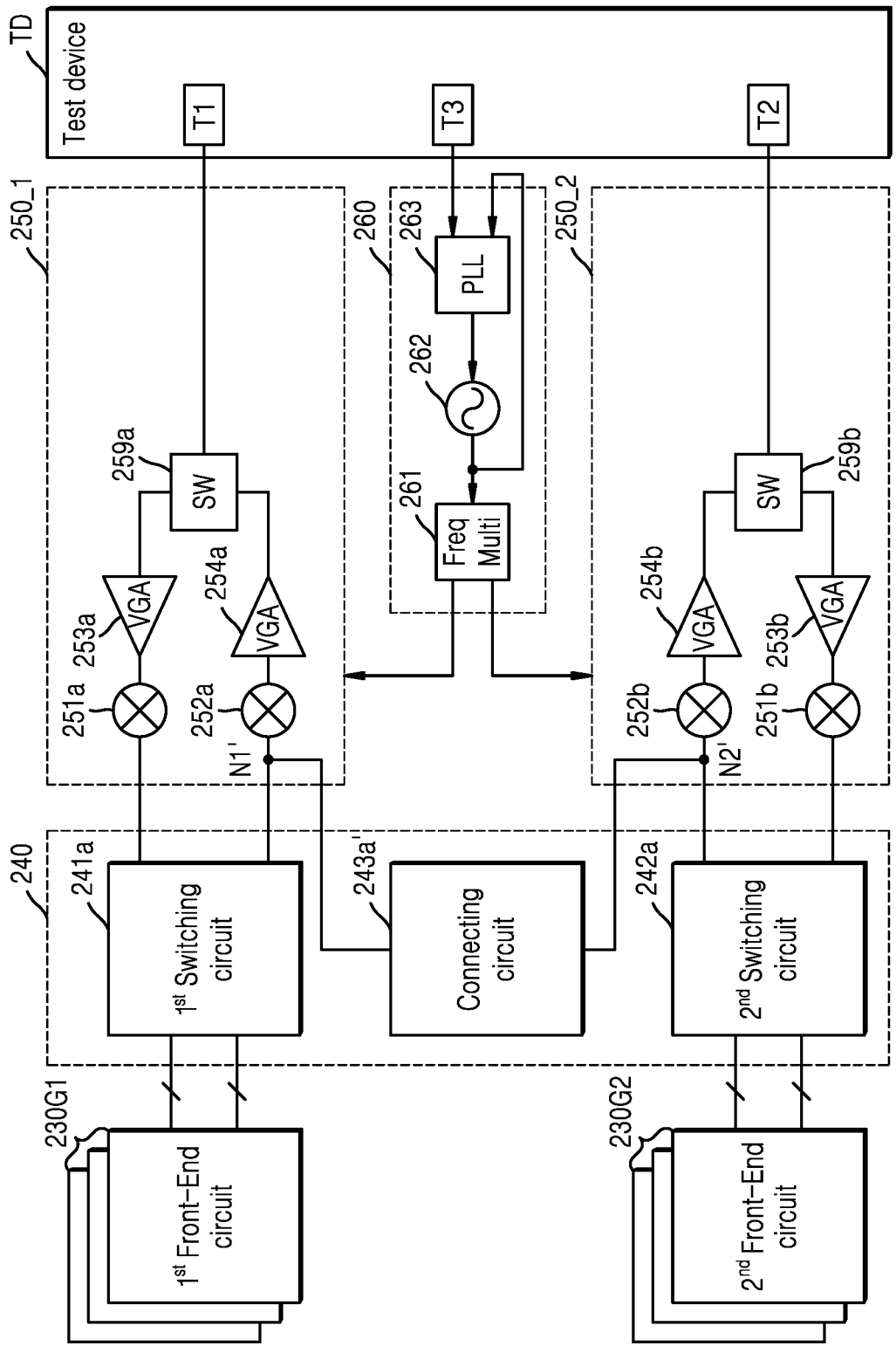
Figure 4C:
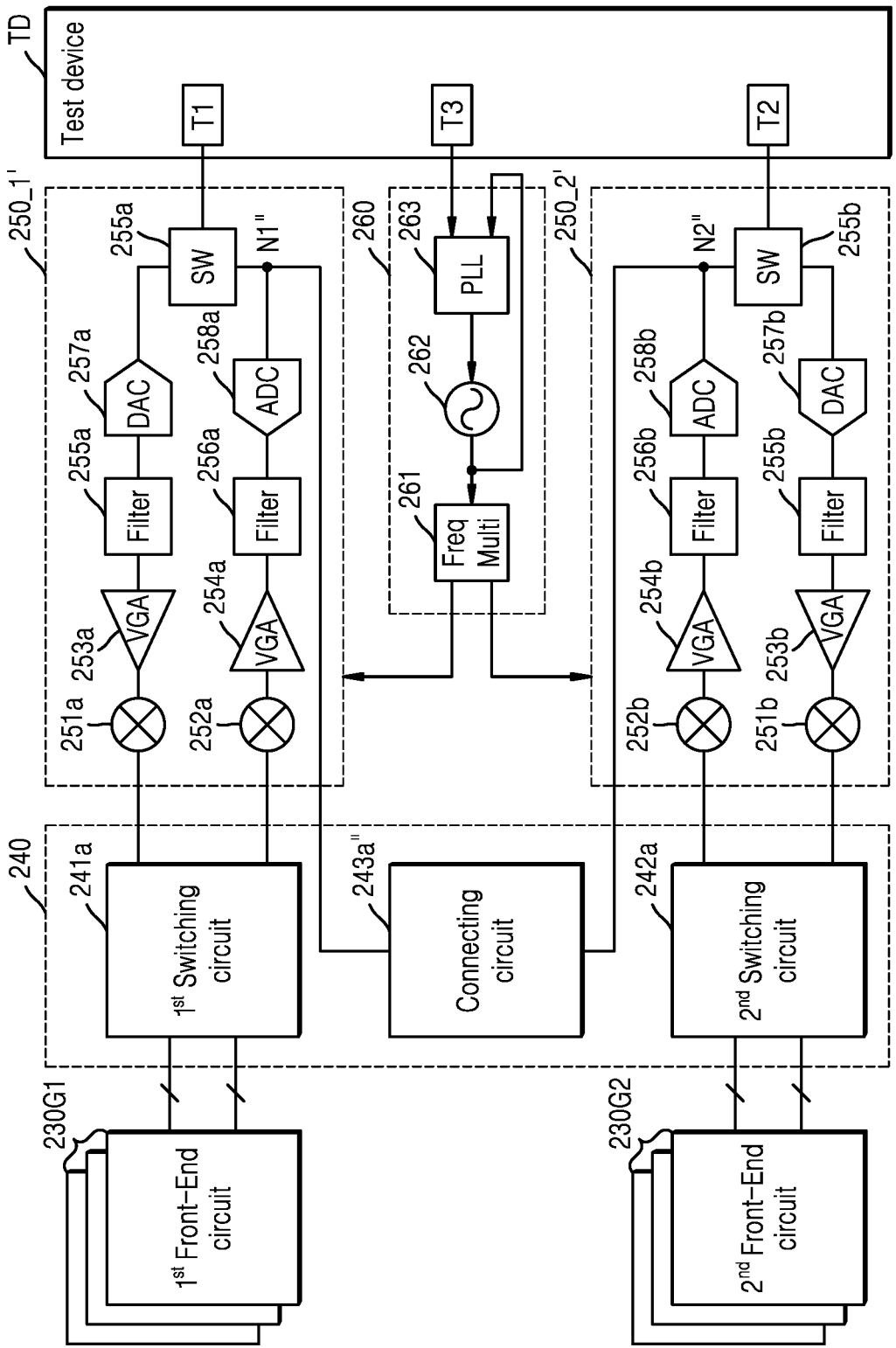

FIGS. 4A to 4C are block diagrams for describing a switching circuit and transceiver circuits on which a characteristic evaluation test according to an embodiment is performed. In FIGS. 4A to 4C, the first transceiver circuit 250_1 is dedicated to a first front-end circuit group 230G1 including the first front-end circuit 230_1 and is selectively connected to the first front-end circuit group 230G1 via the switching circuit 240, and the second transceiver circuit 250_2 is dedicated to a second front-end circuit group 230G2 including the second front-end circuit 230_2 and is selectively connected to the second front-end circuit group 230G2 via the switching circuit 240. Also, it is assumed that the test loop T_Loop in FIG. 4A is formed when the characteristic evaluation test is performed on the first front-end circuit 230_1.

Referring to FIG. 4A, the switching circuit 240 may include a first switching circuit 241a, a second switching circuit 242a, and a connection circuit 243a. The first switching circuit 241a may selectively connect the first front-end circuit group 230G1 to the first transceiver circuit 250_1. The second switching circuit 242a may selectively connect the second front-end circuit group 230G2 to the second transceiver circuit 250_2. The connection circuit 243a according to the embodiment may be configured to selectively connect a first node N1 in the first transceiver circuit 250_1 to a second node N2 in the second transceiver circuit 250_2, so that a frequency up-conversion and a frequency down-conversion of the test input signal may be performed in the first transceiver circuit 250_1, and the second transceiver circuit 250_2 may output the test input signal that has passed through the test loop T_Loop as a test output signal.

The first transceiver circuit 250_1 may include mixers 251a and 252a for frequency conversion, variable gain amplifiers 253a and 254a, and a switching device 259a, and the second transceiver circuit 250_2 may include mixers 251b and 252b for frequency conversion, variable gain amplifiers 253b and 254b, and a switching device 259b. The first transceiver circuit 250_1 and the second transceiver circuit 250_2 may be connected to a local oscillator 260 that generates frequency signals that are necessary for performing the frequency conversion operation. The local oscillator 260 may include a frequency multiplier 261, a voltage controlled oscillator (VCO) 262, and a phase locked loop (PLL) circuit 263. The test device TD may include a first terminal T1 outputting a test input signal, a second terminal T2 receiving a test output signal, and a third terminal T3 outputting a reference signal.

The test loop T_Loop according to the embodiment may include a first loop path LP1 in the first transceiver circuit 250_1 for amplifying and up-converting the test input signal received by the first transceiver circuit 250_1, a second loop path LP2 in the first transceiver circuit 250_1 for amplifying and down-converting the test input signal that has passed through the first front-end circuit 230_1, and a third loop path LP3 in the second transceiver circuit 250_2 for outputting the test input signal that has passed through the second loop path LP2 to the test device TD as a test output signal.

The first loop path LP1 may pass through the variable gain amplifier 253a that amplifies the test input signal and the mixer 251a for up-converting the frequency of the test input signal. The test input signal received by the first transceiver circuit 250_1 from the test device TD is a signal of a baseband or an intermediate frequency band, and may be converted into a signal of an RF band by the mixer 251a when passing through the first loop path LP1. The second loop path LP2 may pass through the mixer 252a for down-converting the frequency of the test input signal that has passed through the first front-end circuit 230_1, and the variable gain amplifier 254a for amplifying the test input signal. The test input signal that has passed through the first front-end circuit 230_1 is a signal of the RF band, and may be converted into a signal of the base band or the intermediate frequency band by the mixer 252a and may be amplified by the variable gain amplifier 254a when passing through the second loop path LP2.

The test device TD may provide the local oscillator 260 with a reference signal so that the local oscillator 260 may generate a frequency signal having a frequency that is necessary for the frequency conversion during the characteristic evaluation test. The local oscillator 260 generates the frequency signal based on the reference signal, and may provide the frequency signal to the mixers 251a and 252a of the first transceiver circuit 250_1.

Whenever the test device TD receives the test output signal via the second terminal T2, the test device TD measures the magnitude of the test output signal and may store the measured magnitude of the test output signal as a test result after matching the measured magnitude to a shift degree of the target phase shifter of the first front-end circuit 230_1. The test device TD may determine whether the first front-end circuit 230_1 is defective based on the test result.

Referring to FIG. 4B, when compared with FIG. 4A, a connection circuit 243a' may be configured to selectively connect a first node N1' in the first transceiver circuit 250_1 to a second node N2' in the second transceiver circuit 250_2, so that a frequency up-conversion of the test input signal may be performed in the first transceiver circuit 250_1 and a frequency down-conversion of the test input signal that has passed through the first front-end circuit 230_1 may be performed in the second transceiver circuit 250_2.

Referring to FIG. 4C, when compared with FIG. 4A, a first transceiver circuit 250_1' may further include filters 255a and 256a, a digital-analog (D/A) converter 257a, and an analog-digital (A/D) converter 258a, and a second transceiver circuit 250_2' may further include filters 255b and 256b, a D/A converter 257b, and an A/D converter 258b. A connection circuit 243a" may be configured to selectively connect a first node N1" in the first transceiver circuit 250_1' to a second node N2" in the second transceiver circuit 250_2', so that A/D conversion, a predetermined band filtering, frequency up-conversion, frequency down-conversion, and D/A conversion of the test input signal may be performed in the first transceiver circuit 250_1', and the second transceiver circuit 250_2' may output the test input signal that has passed through the test loop as the test output signal.

However, the inventive concept is not limited to the examples illustrated in FIGS. 4A to 4C, and various embodiments of receiving the test input signal via the first transceiver circuit 250_1 and outputting the test output signal via the second transceiver circuit 250_2 by passing the test input signal through the test loop T_Loop for performing the characteristic evaluation test on the first front-end circuit 230_1 may be implemented.

Figure 5A:
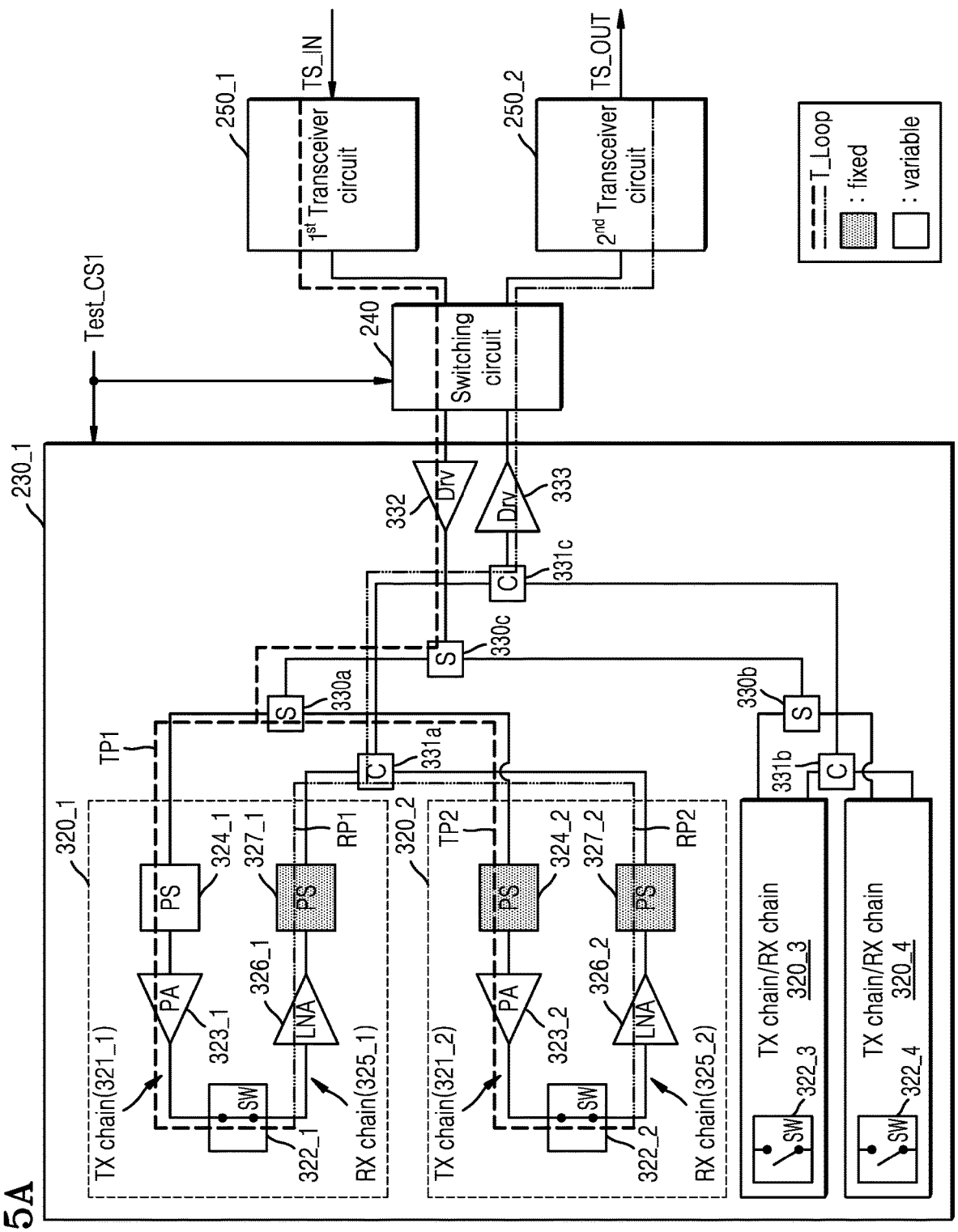
FIGS. 5A and 5B are block diagrams for describing in detail a first front-end circuit on which a characteristic evaluation test according to an embodiment is performed.
Figure 5B:
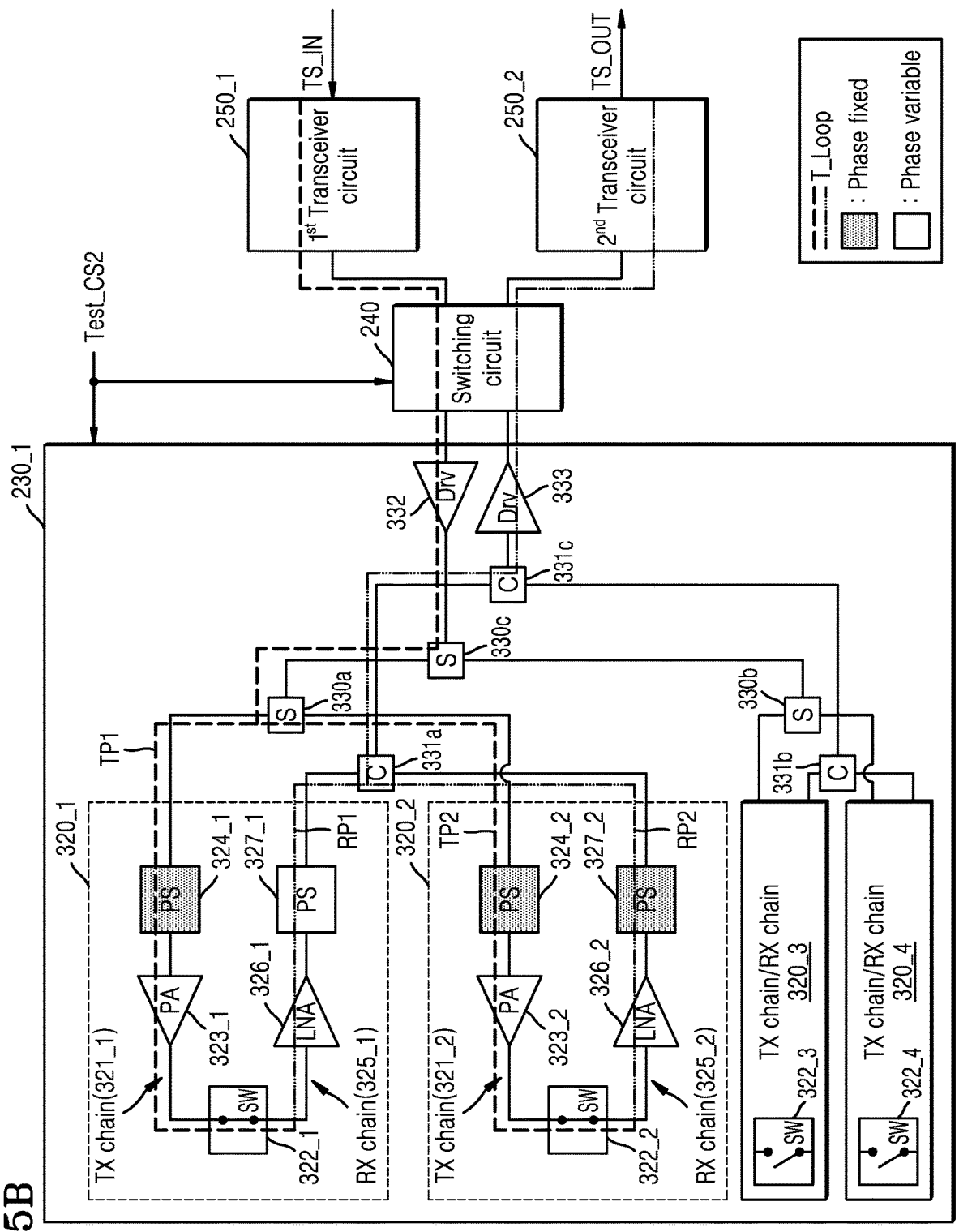

FIGS. 5A and 5B are block diagrams for describing in detail the first front-end circuit 230_1 on which a characteristic evaluation test according to an embodiment is performed.

Referring to FIG. 5A, in order to perform a characteristic evaluation test on the first front-end circuit 230_1, the test loop T_Loop may be formed by using the first transmission/reception chain 320_1 and the second transmission/reception chain 320_2. In detail, the switching device 322_1 included in the first transmission/reception chain 320_1 may connect the transmission chain 321_1 to a reception chain 325_1 in response to a test control signal Test_CS1. The switching device 322_2 included in the second transmission/reception chain 320_2 may connect the transmission chain 321_2 to a reception chain 325_2 in response to the test control signal Test_CS1. Also, the switching device 322_3 included in the third transmission/reception chain 320_3 and the switching device 322_4 included in the fourth transmission/reception chain 320_4 may not connect the transmission chains to the reception chains thereof, in response to the test control signal Test_CS1.

The test loop T_Loop formed through the above connection may include a first transmission path TP1 and a first reception path RP1 of the first transmission/reception chain 320_1, and a second transmission path TP2 and a second reception path RP2 of the second transmission/reception chain 320_2. After forming the test loop T_Loop, a phase shifter 324_1 connected to the transmission chain 321_1 of the first transmission/reception chain 320_1 may be selected as a target phase shifter, and a shift degree of the phase shifter 324_1 may be adjusted based on the test control signal Test_CS1. Shift degrees of the phase shifters 327_1, 324_2, and 327_2, through which the test loop T_Loop passes, other than the target phase shifter (phase shifter 324_1) may be fixed as predetermined values.

As an example, when the shift degree of the target phase shifter (phase shifter 324_1) is adjusted as a first value, the test input signal TS_IN input to the first transceiver circuit 250_1 passes through the test loop T_Loop and then may be output as a test output signal TS_OUT via the second transceiver circuit 250_2. After that, the shift degree of the target phase shifter (phase shifter 324_1) may be adjusted to be a second value, and then, the test input signal TS_IN is input to the first transceiver circuit 250_1 and then may be output as the test output signal TS_OUT via the second transceiver circuit 250_2 after passing through the test loop T_Loop. The characteristic evaluation test on the target phase shifter (phase shifter 324_1) may be performed by using a plurality of test output signals TS_OUT that are output by adjusting the shift degree of the target phase shifter (phase shifter 324_1) a plurality of times in the above manner.

Referring to FIG. 5B, when the characteristic evaluation test on the target phase shifter (phase shifter 324_1) in FIG. 5A is finished, a next target phase shifter may be selected and a characteristic evaluation test thereon may be performed. As an example, the phase shifter 327_1 connected to the reception chain 325_1 of the first transmission/reception chain 320_1 may be selected as the target phase shifter, and a shift degree of the phase shifter 327_1 may be adjusted based on the test control signal Test_CS2, and the characteristic evaluation test on the target phase shifter 327_1 may be performed in the above-described manner.

Figure 6:
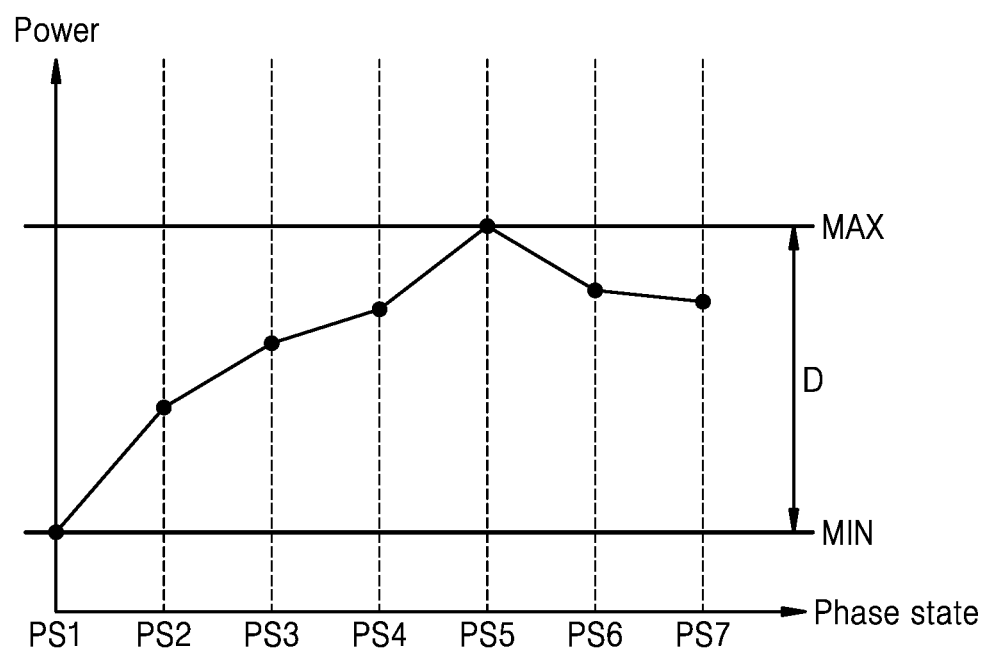
FIG. 6 is a diagram for describing a characteristic evaluation test method using a magnitude of a test output signal, according to an embodiment.

FIG. 6 is a diagram for describing a characteristic evaluation test method by using a magnitude of a test output signal according to an embodiment. Hereinafter, descriptions about FIG. 6 may be provided with reference to FIG. 5A.

Referring to FIGS. 5A and 6, a phase state is determined according to the shift degree of the target phase shifter (phase shifter 324_1), for example, it may be defined as a first phase state PS1 when the target phase shifter (phase shifter 324_1) has a shift degree of a first value. The test input signal TS_IN may be separated by the splitter 330a and may pass through the first transmission/reception chain 320_1 and the second transmission/reception chain 320_2. After that, the test input signals TS_IN that has passed through the first transmission/reception chain 320_1 and the second transmission/reception chain 320_2 are combined by the combiner 331a and then may be output as the test output signal TS_OUT. A phase difference between the test input signal TS_IN that has passed through the first transmission/reception chain 320_1 and the test input signal TS_IN that has passed through the second transmission/reception chain 320_2 depends upon the shift degree of the target phase shifter (phase shifter 324_1), and thus, the magnitude of the test output signal TS_OUT may vary depending on the adjustment of the shift degree of the target phase shifter (phase shifter 324_1).

Therefore, the characteristic evaluation test of the target phase shifter (phase shifter 324_1) may be performed by using the magnitude of the test output signal TS_OUT. That is, in a case where the target phase shifter (phase shifter 324_1) is defective and the shift degree of the target phase shifter (phase shifter 324_1) is not accurately adjusted by the test control signal Test_CS1, a variation in the magnitude of the test output signal TS_OUT may be also reduced.

In FIG. 6, the phase state of the target phase shifter (phase shifter 324_1) may be controlled to be one of first to seventh phase states PS1 to PS7, and the characteristic evaluation test on the target phase shifter (phase shifter 324_1) may be performed by measuring the magnitude of the test output signal TS_OUT in each of the first to seventh phase states PS1 to PS7. As an embodiment, whether the target phase shifter (phase shifter 324_1) is defective may be determined based on a difference D between a maximum magnitude MAX and a minimum magnitude MIN_PL of the test output signal TS_OUT. For example, when the difference D is equal to or less than a critical value, the target phase shifter (phase shifter 324_1) may be determined to be defective, and when the difference D exceeds the critical value, the target phase shifter (phase shifter 324_1) may be determined to be normal. After that, when the target phase shifter (phase shifter 324_1) is determined to be normal, another phase shifter in the first front-end circuit 230_1 may be selected as the target phase shifter, and the characteristic evaluation test thereon may be performed. On the other hand, when the target phase shifter (phase shifter 324_1) is determined to be defective, the first front-end circuit 230_1 is determined to be defective and the characteristic evaluation test on the first front-end circuit 230_1 may be terminated.

As another embodiment, the characteristic evaluation test on the target phase shifter (phase shifter 324_1) may be performed by measuring a variation of the test output signal TS_OUT according to change of the phase state PS. For example, the target phase shifter (phase shifter 324_1) may be determined to be defective when an average variation of the test output signal TS_OUT according to the change in the phase state TS is equal to or less than a critical value, and the target phase shifter (phase shifter 324_1) may be determined to be normal when the average variation exceeds the critical value.

Figure 7:
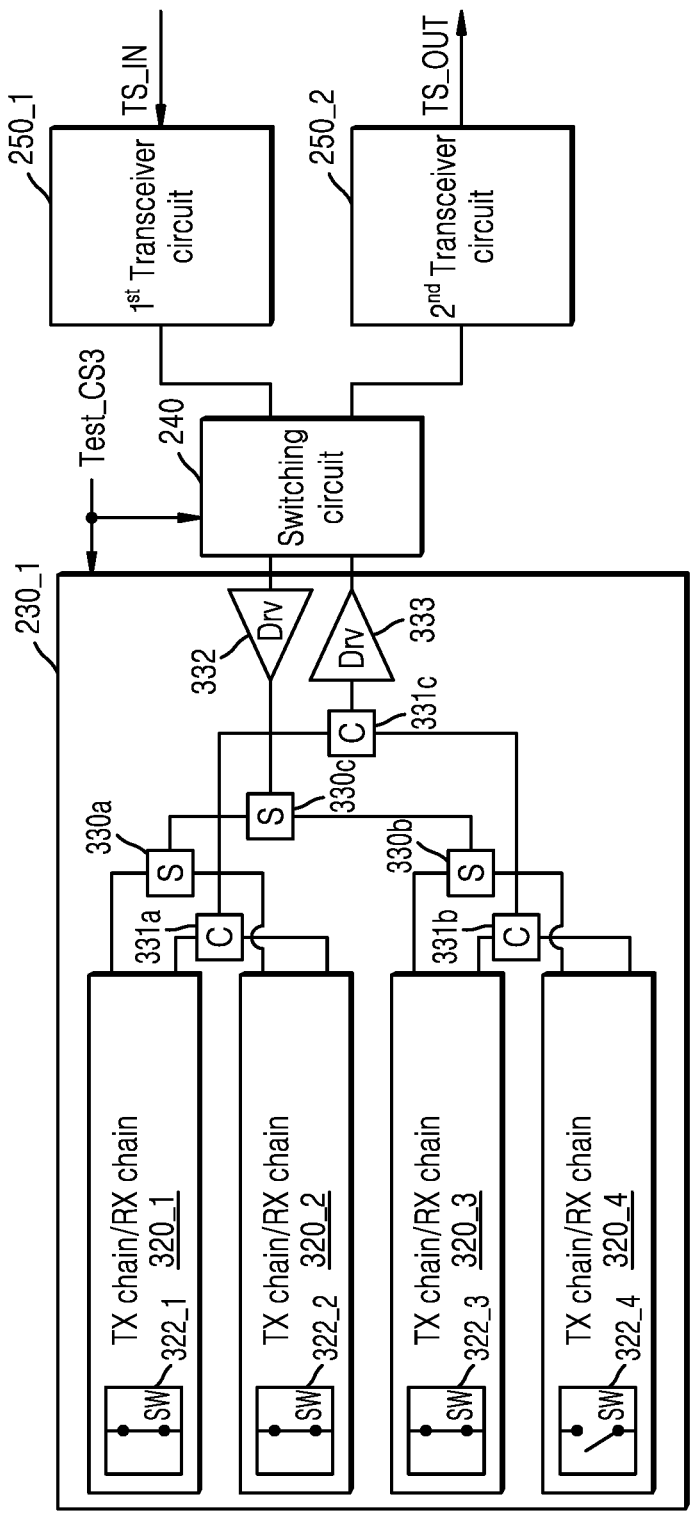
FIG. 7 is a block diagram for describing a first front-end circuit on which a noise-resistant characteristic evaluation test according to an embodiment is performed.

FIG. 7 is a block diagram for describing the first front-end circuit 230_1 on which a noise-resistant characteristic evaluation test according to an embodiment is performed.

Referring to FIG. 7, as compared with FIG. 5A, a test loop may be formed by using the first transmission/reception chain 320_1, the second transmission/reception chain 320_2, and the third transmission/reception chain 320_3 for performing the characteristic evaluation test on the first front-end circuit 230_1. The switching devices 322_1 to 322_4 respectively included in the first to fourth transmission/reception chains 320_1 to 320_4 may be controlled based on a test control signal Test_CS3, and the transmission chains and the reception chains in the first to third transmission/reception chains 320_1 to 320_3, except for the fourth transmission/reception chain 320_4, may be connected to each other. That is, in order to perform the characteristic evaluation test on the first front-end circuit 230_1, the test loop may be formed by using three or more transmission/reception chains from among the plurality of first to fourth transmission/reception chains 320_1 to 320_4.

As described above, as the number of transmission/reception chains in the first front-end circuit 230_1, which are used to form the test loop for performing the characteristic evaluation test, increases, a noise-resistant characteristic evaluation test may be performed, and detailed descriptions thereof will be described below with reference to FIG. 8.

Figure 8:
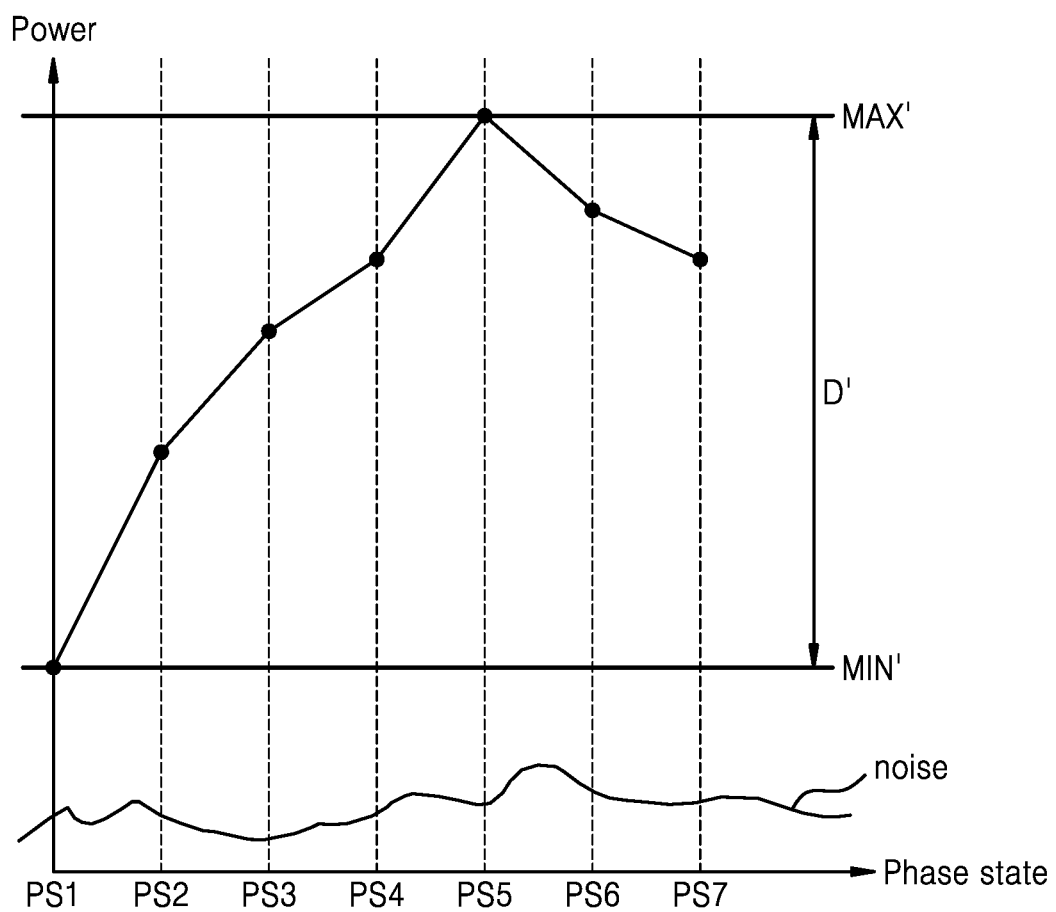
FIG. 8 is a diagram for describing an effect when a characteristic evaluation test is performed by forming a test loop by using more transmission/reception chains than those of FIG. 5A.

FIG. 8 is a diagram for describing an effect when the characteristic evaluation test is performed by forming the test loop by using more transmission/reception chains than those of FIG. 5A. Hereinafter, descriptions about FIG. 8 may be provided with reference to FIG. 7.

Referring to FIGS. 7 and 8, since the characteristic evaluation test is performed on the first front-end circuit 230_1 by using more transmission/reception chains 320_1 to 320_3 than those of FIG. 5A, a magnitude of the test output signal TS_OUT output from the second transceiver circuit 250_2 may be greater than that of FIG. 5A. When the characteristic evaluation test is performed on the first front-end circuit 230_1, there may be peripheral noise (e.g., noise in the first front-end circuit 230_1). Here, the noise-resistant characteristic evaluation test may be performed on the first front-end circuit 230_1 by using the test output signal TS_OUT having a greater magnitude than that of FIG. 6. In detail, a maximum magnitude MAX' and a minimum magnitude MIN' of the test output signal TS_OUT may be greater than those of FIG. 6, and a critical value compared with a difference D' between the maximum magnitude MAX' and the minimum magnitude MIN' may be greater than that of FIG. 6. Except for the above difference, detailed descriptions are the same as those provided with reference to FIG. 6, and thus, are omitted here.

Figure 9:
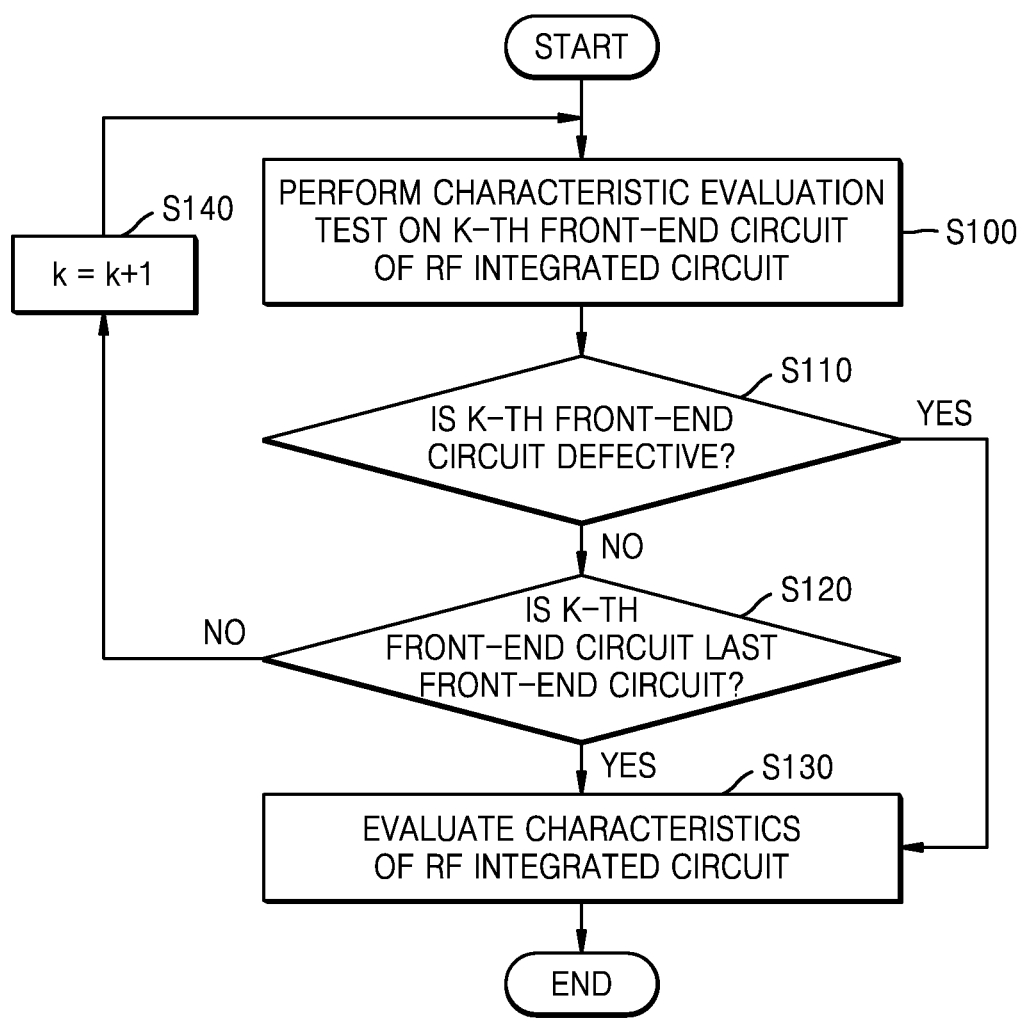
FIG. 9 is a flowchart for describing a method of performing a characteristic evaluation test on an RF integrated circuit, according to an embodiment.

FIG. 9 is a flowchart for describing a method of performing a characteristic evaluation test on an RF integrated circuit according to an embodiment.

Referring to FIG. 9, a characteristic evaluation test on a k-th front-end circuit of the RF integrated circuit may be performed (S100). The RF integrated circuit may include a plurality of front-end circuits, and each of the front-end circuits may include a plurality of phase shifters capable of controlling a phase of an RF signal transmitted/received through a connected antenna. The characteristic evaluation test on the k-th front-end circuit may denote the characteristic evaluation test performed on phase shifters in the k-th front-end circuit.

Whether the k-th front-end circuit is defective may be determined based on a result of performing the characteristic evaluation test on the k-th front-end circuit (S110). As an example, when at least one of the plurality of phase shifters in the k-th front-end circuit is defective (or when the predetermined number of phase shifters or greater in the k-th front-end circuit are defective), it may be determined that the k-th front-end circuit is defective. When the k-th front-end circuit is not defective (NO to S110), it may be determined whether the k-th front-end circuit is the last front-end circuit to be a target of the characteristic evaluation test in the RF integrated circuit (S120). When the k-th front-end circuit is defective (YES to S110), the characteristic evaluation test on the RF integrated circuit is terminated, and characteristics of the RF integrated circuit may be evaluated (S130). That is, since the k-th front-end circuit of the RF integrated circuit is defective, the RF integrated circuit may be determined to be defective.

When the k-th front-end circuit is not the last front-end circuit to be the target of the characteristic evaluation test in the RF integrated circuit (NO to S120), a value of k is counted up (S140), and a characteristic evaluation test may be performed on a next front-end circuit in operation S100. When the k-th front-end circuit is the last front-end circuit to be the target of the characteristic evaluation test in the RF integrated circuit (YES to S120), characteristics of the RF integrated circuit may be evaluated based on results of the characteristic evaluation tests performed on the front-end circuits in the RF integrated circuit (S130).

Figure 10:
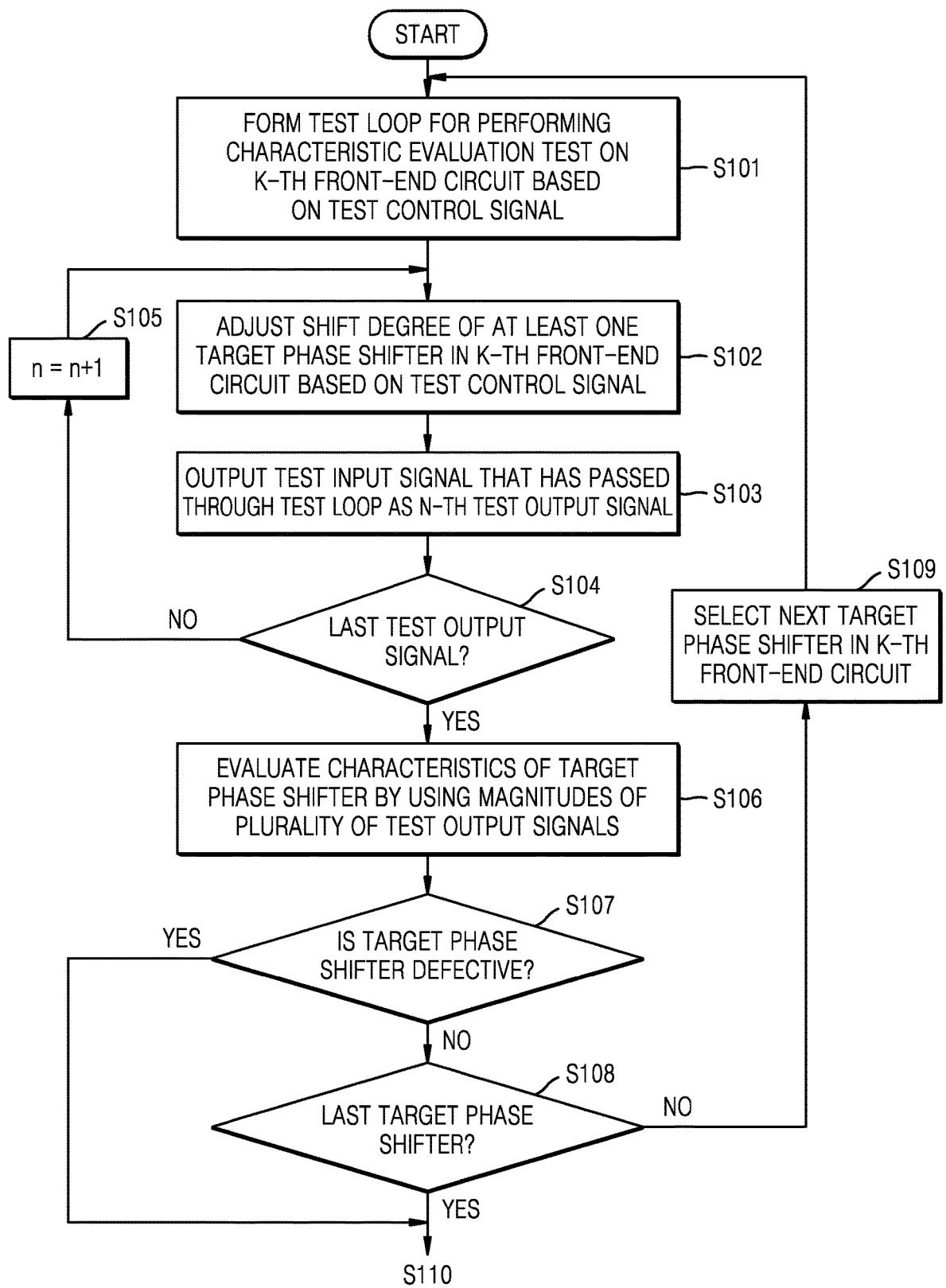
FIG. 10 is a flowchart for describing operation S100 of FIG. 9 in more detail.

FIG. 10 is a flowchart for describing operation S100 of FIG. 9 in more detail.

Referring to FIG. 10, the test loop for performing the characteristic evaluation test of the k-th front-end circuit may be formed in the RF integrated circuit based on the test control signal (S101). The formed test loop may pass through the target phase shifter so that the characteristic evaluation test may be performed on the target phase shifter. The shift degree of the at least one target phase shifter in the k-th front-end circuit may be adjusted based on the test control signal (S102). The target phase shifter may be selected based on the test control signal. The test input signal that has passed through the test loop may be output as an n-th test output signal (S103). It may be determined whether the n-th test output signal is the last test output signal (S104). When the n-th test output signal is not the last test output signal (NO to S104), a value of n is counted up (S105), and then, the shift degree of the target phase shifter may be adjusted in operation S102 to output a next test output signal. When the n-th test output signal is the last output signal (YES to S104), characteristics of the target phase shifter may be evaluated by using magnitudes of the plurality of test output signals that are output while adjusting the shift degree of the target phase shifter (S106). As an example, the characteristic evaluation of the target phase shifter may include an operation of comparing a difference between the maximum magnitude of the test output signal and the minimum magnitude of the test output signal from among the plurality of test output signals with a critical value.

Whether the target phase shifter is defective may be determined based on a result of the characteristic evaluation of the target phase shifter (S107). As an example, when the difference between the maximum magnitude and the minimum magnitude of the test output signals from among the test output signals is equal to or less than the critical value, the target phase shifter may be determined to be defective. When the target phase shifter is determined to be defective (S107), the result of determining the target phase shifter to be defective may be used to determine whether the k-th front-end circuit is defective in operation S110 (FIG. 9). For example, when the target phase shifter is defective, it may be determined that the k-th front-end circuit is defective.

When the target phase shifter is not defective (NO to S107), it may be determined whether the target phase shifter is the last target phase shifter in the k-th front-end circuit (S108). When the target phase shifter is not the last target phase shifter in the k-th front-end circuit (NO to S108), a next target phase shifter in the k-th front-end circuit may be selected (S109). The next target phase shifter may be selected based on the test control signal. Returning back to operation S101, a test loop passing through the next target phase shifter is formed to perform the characteristic evaluation test on the next target phase shifter, and then, the characteristic evaluation test may be performed by using the test loop.

Figure 11A:
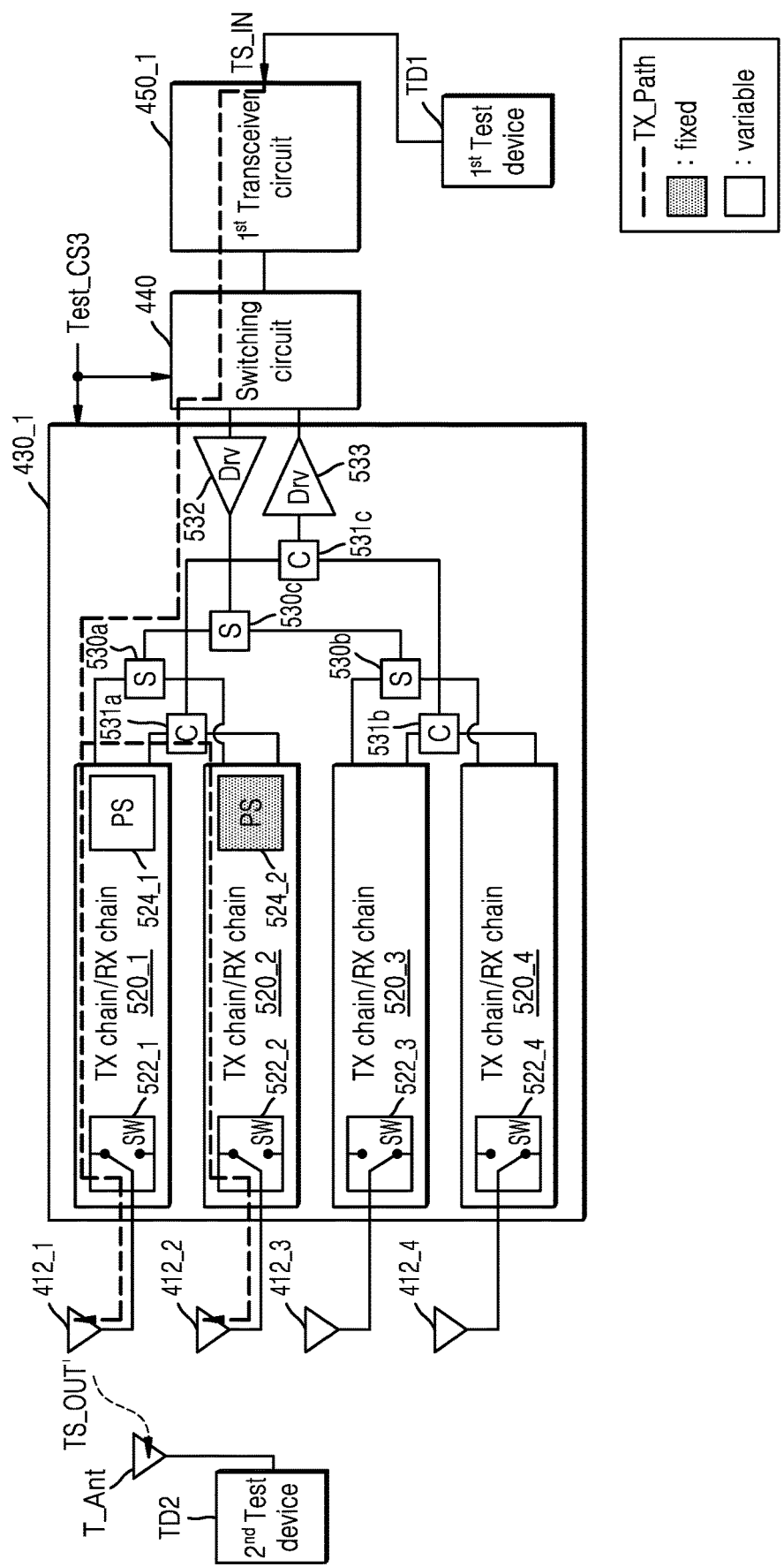
FIGS. 11A and 11B are block diagrams for describing a method of performing a characteristic evaluation test by using transmission paths in an RF integrated circuit.
Figure 11B:
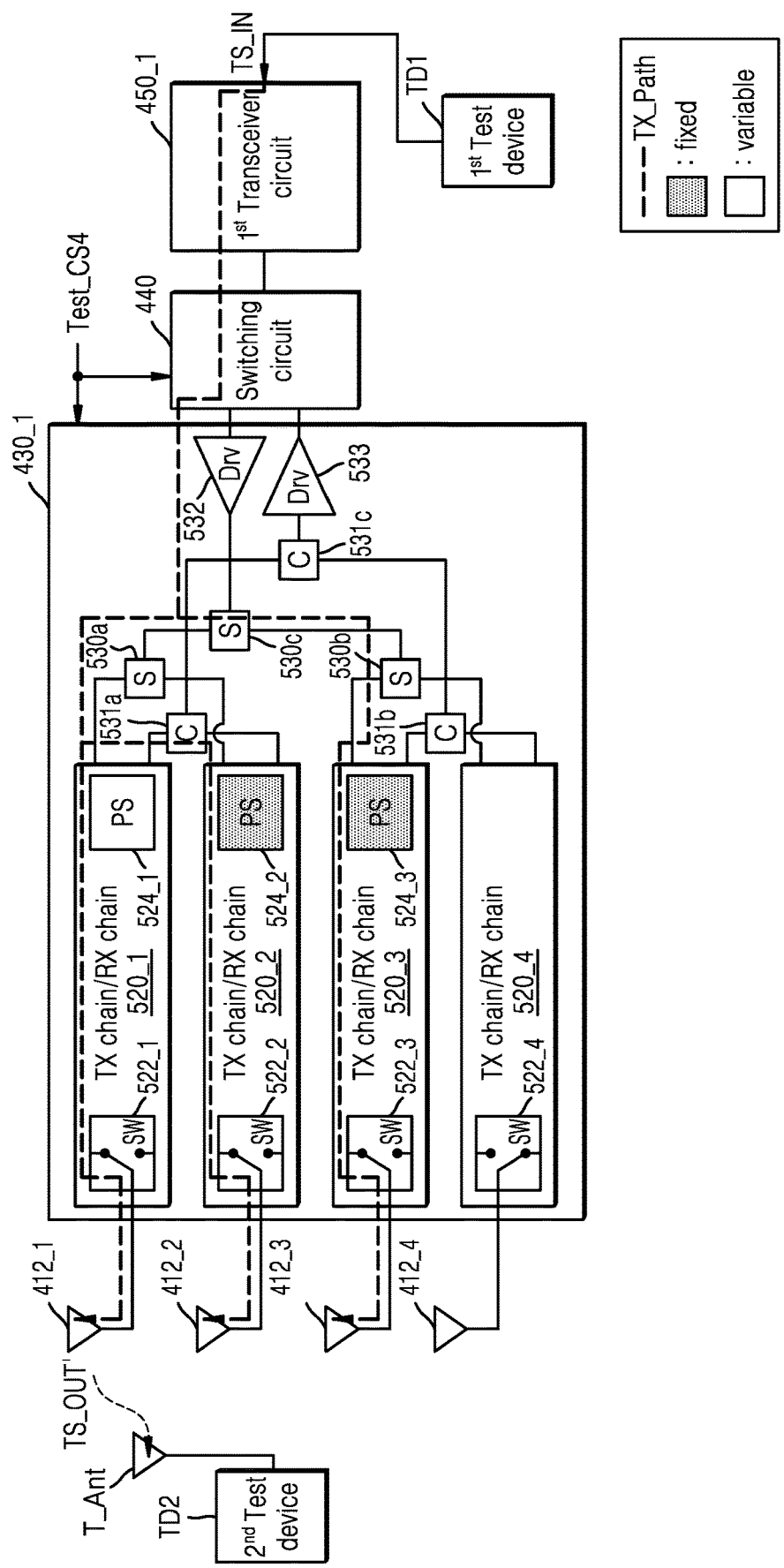
Figure 11C:
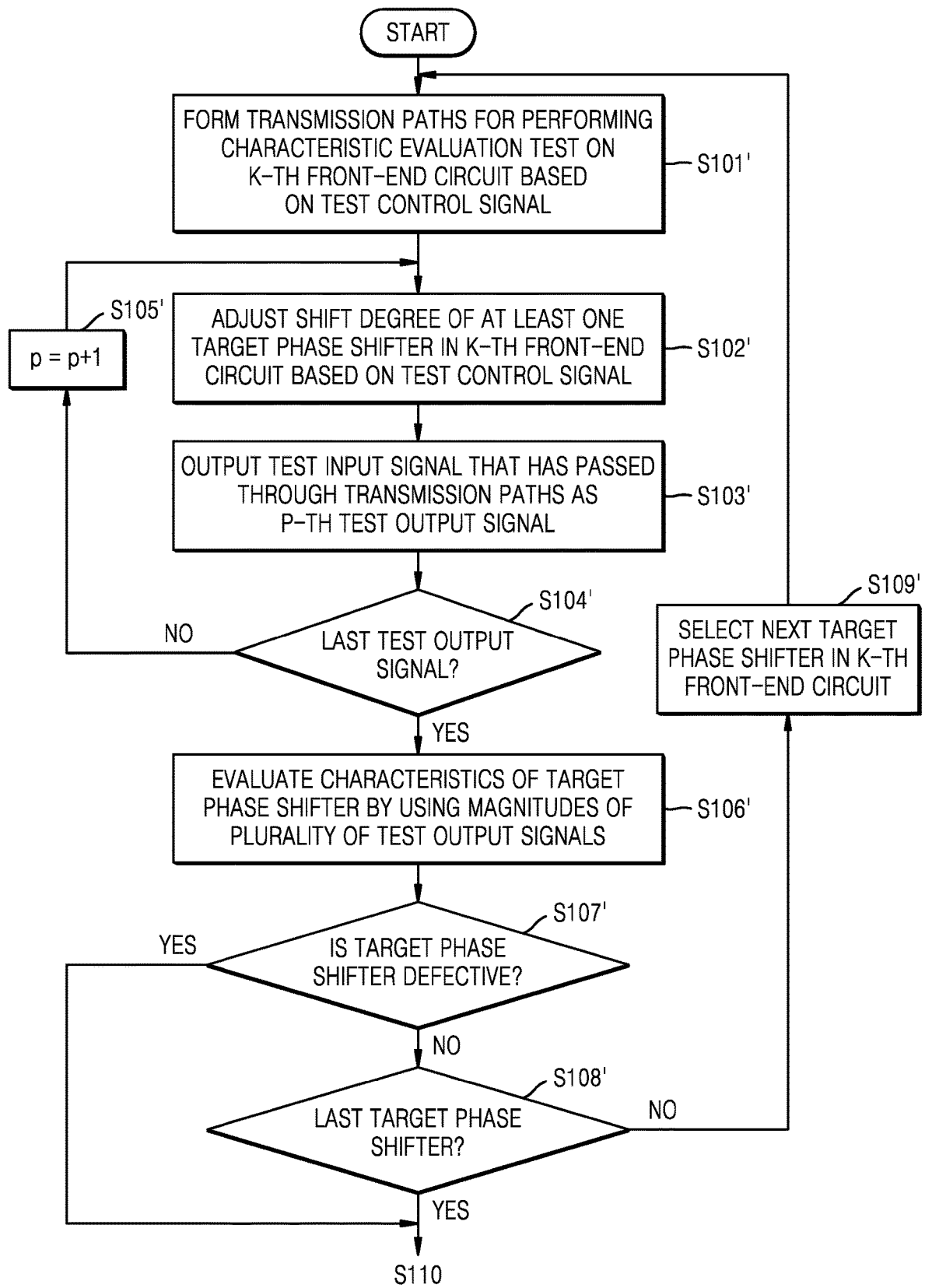
FIG. 11C is a flowchart for describing operation S100 of FIG. 9 using transmission paths as shown in FIGS. 11A and 11B.

FIGS. 11A and 11B are block diagrams for describing a method of performing the characteristic evaluation test by using transmission paths in an RF integrated circuit, and FIG. 11C is a flowchart for describing operation S100 of FIG. 9 using transmission paths as shown in FIGS. 11A and 11B. A first front-end circuit 430_1 has similar configurations to those of the first front-end circuit 230_1 of FIG. 5A, except that first to fourth transmission/reception chains 520_1 to 520_4 are respectively connected to first to fourth antennas 412_1 to 412_4, and thus, overlapping descriptions are omitted. As an embodiment, the antennas 412_1 to 412_4 may be implemented as differential feeding antennas or array antennas, and detailed embodiment thereof will be described below with reference to FIGS. 13A to 13C.

Referring to FIG. 11A, transmission paths may be formed by using a first transmission/reception chain 520_1 and a second transmission/reception chain 520_2 in order to perform the characteristic evaluation test on the front-end circuit 430_1 in the RF integrated circuit. Hereinafter, transmission/reception chains 520_1 and 520_2 that are selected to form the transmission paths may be referred to as selected transmission/reception chains. In detail, a switch device 522_1 included in the first transmission/reception chain 520_1 may connect a transmission chain to a first antenna 412_1 in response to a test control signal Test_CS3. A switch device 522_2 included in the second transmission/reception chain 520_2 may connect a transmission chain to a second antenna 412_2 in response to the test control signal Test_CS3. Also, a switch device 522_3 included in the third transmission/reception chain 520_3 and a switch device 522_4 included in the fourth transmission/reception chain 520_4 may not connect transmission chains thereof to the antennas 412_3 and 412_4 in response to the test control signal Test_CS3, respectively.

Through the above connection, the transmission paths passing through the transmission chains of the first and second transmission/reception chains 520_1 and 520_2 may be obtained. After forming the transmission paths, a phase shifter 524_1 connected to the transmission chain of the first transmission/reception chain 520_1 may be selected as a target phase shifter, and a shift degree thereof may be adjusted based on the test control signal Test_CS3. A shift degree of a phase shifter 524_2, through which the transmission paths pass, other than the target phase shifter 524_1 may be fixed as a predetermined value.

As an example, when the shift degree of the target phase shifter 524_1 is adjusted as a first value, a test input signal TS_IN input from a first test device TD1 to a first transceiver circuit 450_1 passes through the transmission paths and then may be output as a test output signal TS_OUT via the first and second antennas 412_1 and 412_2. A second test device TD2 includes a test antenna T_Ant, and may receive the test output signal TS_OUT via the test antenna T_Ant. After that, the shift degree of the target phase shifter 524_1 may be adjusted to a second value, and the test input signal TS_IN may pass through the transmission paths and may be output as the test output signal TS_OUT via the first and second antennas 412_1 and 412_2. In the above manner, the second test device TD2 receives the plurality of test output signals TS_OUT output by adjusting the shift degree of the target phase shifter 524_1 a plurality of times, and the characteristic evaluation test may be performed on the target phase shifter 524_1 by using the test output signals TS_OUT.

The second test device TD2 may evaluate characteristics of the target phase shifter 524_1 by using the test output signals TS_OUT in the same manner as that of FIG. 6. In addition, the second test device TD2 may evaluate radiation characteristics of the first and second antennas 412_1 and 412_2 by using the test output signals TS_OUT. When the characteristic evaluation test on the target phase shifter 524_1 of the first transmission/reception chain 520_1 is finished, a phase shifter 524_2 of the second transmission/reception chain 520_2 is selected as the target phase shifter to perform a next characteristic evaluation test. When the characteristic evaluation test on the first front-end circuit 430_1 is finished, the characteristic evaluation test on another front-end circuit in the RF integrated circuit may be performed.

Referring to FIG. 11B, since the characteristic evaluation test is performed on the first front-end circuit 430_1 based on a test control signal Test_CS4 by using more transmission/reception chains (520_1 to 520_3) than those of FIG. 11A, a magnitude of the test output signal TS_OUT output through the first to third antennas 412_1 to 412_3 may be greater than that of FIG. 11A. Since the magnitude of the test output signal TS_OUT is greater, the noise-resistant characteristic evaluation test may be performed on the first front-end circuit 430_1, and detailed descriptions are provided above with reference to FIG. 8 and are omitted here.

Referring to FIG. 11C, transmission paths for performing the characteristic evaluation test on the k-th front-end circuit may be formed in the RF integrated circuit based on the test control signal (S101'). The formed transmission paths may pass through the target phase shifter so that the characteristic evaluation test may be performed on the target phase shifter. The shift degree of the at least one target phase shifter in the k-th front-end circuit may be adjusted based on the test control signal (S102'). The target phase shifter may be selected based on the test control signal. The test input signal that has passed through the transmission paths may be output as a p-th test output signal (S103'). It may be determined whether the p-th test output signal is the last output signal (S104'). When the p-th test output signal is not the last test output signal (NO to S104'), p is counted up (S105'), and then, the shift degree of the target phase shifter may be adjusted in operation S102' to output a next test output signal. When the p-th test output signal is the last output signal (YES to S104'), characteristics of the target phase shifter may be evaluated by using magnitudes of the plurality of test output signals that are output while adjusting the shift degree of the target phase shifter (S106').

Whether the target phase shifter is defective may be determined based on a result of the characteristic evaluation of the target phase shifter (S107'). When the target phase shifter is determined to be defective (YES to S107'), the result of determining the target phase shifter to be defective may be used to determine whether the k-th front-end circuit is defective in operation S110 (FIG. 9). For example, when the target phase shifter is defective, it may be determined that the k-th front-end circuit is defective.

When the target phase shifter is not defective (NO to S107'), it may be determined whether the target phase shifter is the last target phase shifter in the k-th front-end circuit (S108'). When the target phase shifter is not the last target phase shifter in the selected transmission/reception chains (NO to S108'), a next target phase shifter may be selected in the k-th front-end circuit (S109'). The next target phase shifter may be selected based on the test control signal. Returning back to operation S101', transmission paths passing through the next target phase shifter are formed to perform the characteristic evaluation test on the next target phase shifter, and then, the characteristic evaluation test may be performed by using the transmission paths.

According to the characteristic evaluation test method described with reference to FIGS. 11A to 11C, whether the phase shifters connected to the plurality of transmission chains in the RF integrated circuit are defective may be determined. Whether the phase shifters connected to the plurality of transmission chains in the RF integrated circuit are defective may be determined according to a characteristic evaluation test method that will be described with reference to FIGS. 12A to 12C.

Figure 12A:
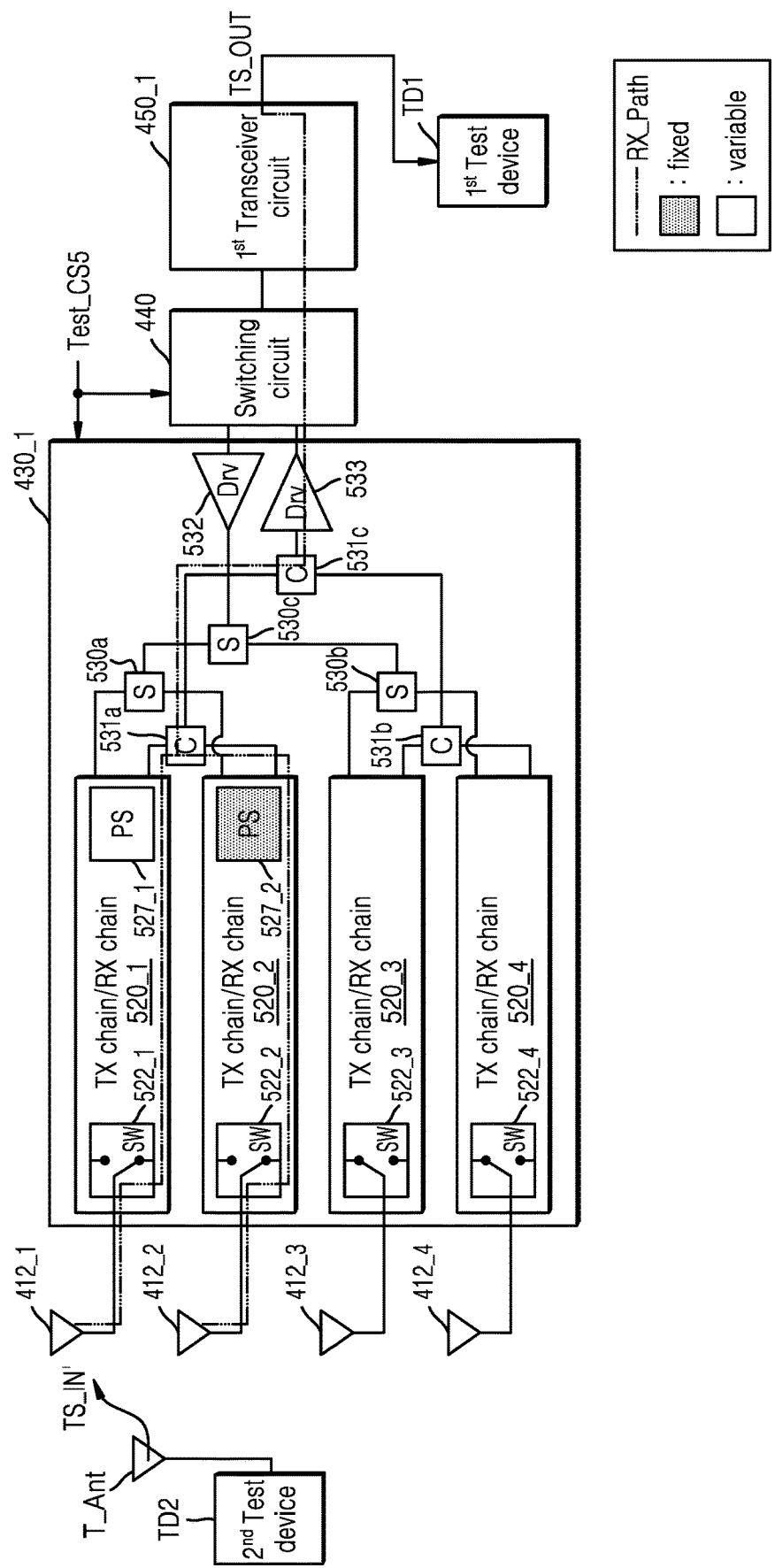
FIGS. 12A and 12B are block diagrams for describing a method of performing a characteristic evaluation test by using reception paths in an RF integrated circuit.
Figure 12B:
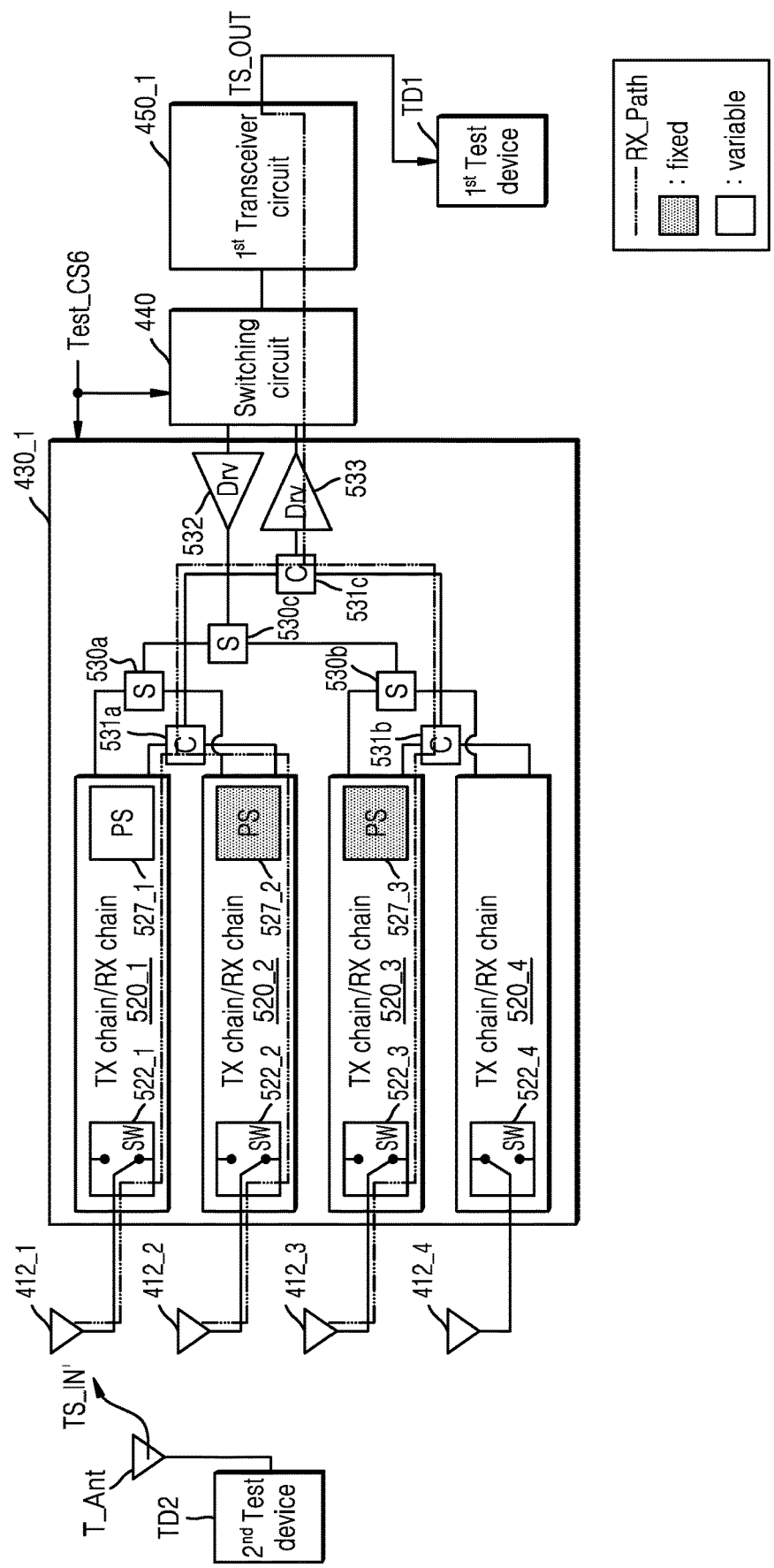
Figure 12C:
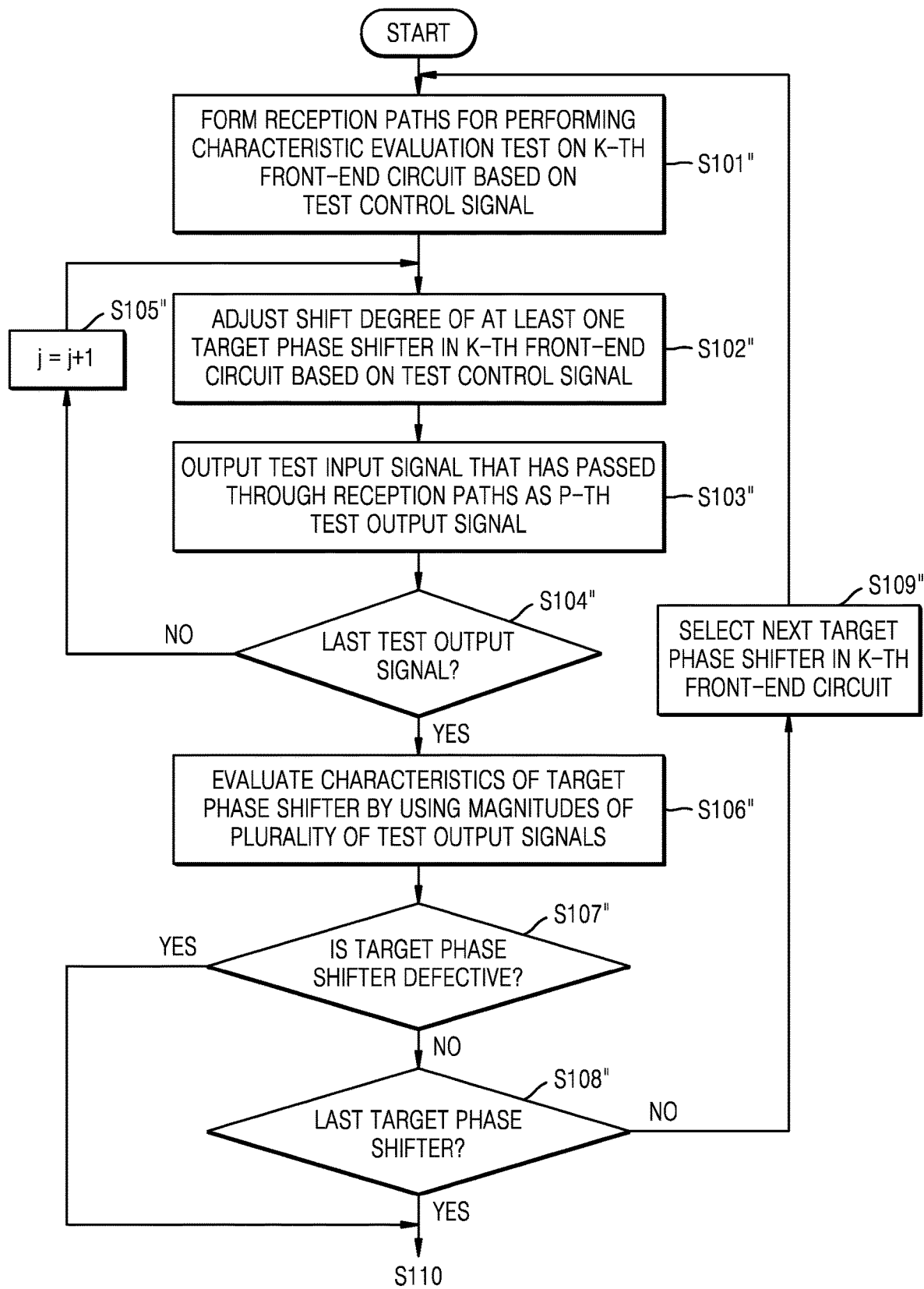
FIG. 12C is a flowchart for describing operation S100 of FIG. 9 using reception paths as shown in FIGS. 12A and 12B.

FIGS. 12A and 12B are block diagrams for describing a method of performing the characteristic evaluation test by using reception paths in the RF integrated circuit, and FIG. 12C is a flowchart for describing operation S100 of FIG. 9 using reception paths as shown in FIGS. 12A and 12B. Since the first front-end circuit 430_1 is described in detail with reference to FIG. 11A, descriptions thereof are omitted.

Referring to FIG. 12A, reception paths may be formed by using a first transmission/reception chain 520_1 and a second transmission/reception chain 520_2 in order to perform the characteristic evaluation test on the front-end circuit 430_1 in the RF integrated circuit. Hereinafter, transmission/reception chains 520_1 and 520_2 that are selected to form the reception paths may be referred to as selected transmission/reception chains. In detail, a switch device 522_1 included in the first transmission/reception chain 520_1 may connect a reception chain to a first antenna 412_1 in response to a test control signal Test_CS5. A switch device 522_2 included in the second transmission/reception chain 520_2 may connect a reception chain to a second antenna 412_2 in response to the test control signal Test_CS5. Also, a switch device 522_3 included in the third transmission/reception chain 520_3 and a switch device 522_4 included in the fourth transmission/reception chain 520_4 may not connect reception chains thereof to the antennas 412_3 and 412_4 in response to the test control signal Test_CS5.

Through the above connection, the reception paths passing through the reception chains of the first and second transmission/reception chains 520_1 and 520_2 may be obtained. After forming the reception paths, a phase shifter 527_1 connected to the reception chain of the first transmission/reception chain 520_1 may be selected as a target phase shifter, and a shift degree thereof may be adjusted based on the test control signal Test_CS5. A shift degree of a phase shifter 527_2, through which the reception paths pass, other than the target phase shifter 527_1 may be fixed as a predetermined value.

As an example, when the shift degree of the target phase shifter 527_1 is adjusted as a first value, a test input signal TS_IN' transmitted from the test antenna T_Ant of the second test device TD2 is received by the first antenna 412_1 and the second antenna 412_2, pass through the reception paths, and may be output as a test output signal TS_OUT' via the first transceiver circuit 450_1. The first test device TD1 may receive the test output signal TS_OUT'.

After that, the shift degree of the target phase shifter 527_1 may be adjusted to a second value, and a test input signal TS_IN' transmitted from the test antenna T_Ant of the second test device TD2 is received by the first antenna 412_1 and the second antenna 412_2, pass through the reception paths, and may be output as a test output signal TS_OUT' via the first transceiver circuit 450_1. In the above manner, the first test device TD1 receives the plurality of test output signals TS_OUT' output by adjusting the shift degree of the target phase shifter 527_1 a plurality of times, and the characteristic evaluation test may be performed on the target phase shifter 527_1 by using the test output signals TS_OUT'.

The first test device TD1 may evaluate characteristics of the target phase shifter 527_1 by using the test output signals TS_OUT' in the same manner as that of FIG. 6. In addition, the second test device TD2 may evaluate receiving characteristics of the first and second antennas 412_1 and 412_2 by using the test output signals TS_OUT'. When the characteristic evaluation test on the target phase shifter 527_1 of the first transmission/reception chain 520_1 is finished, a phase shifter 527_2 of the second transmission/reception chain 520_2 is selected as the target phase shifter to perform a next characteristic evaluation test. When the characteristic evaluation test on the first front-end circuit 530a is finished, the characteristic evaluation test on another front-end circuit in the RF integrated circuit may be performed.

Referring to FIG. 12B, since the characteristic evaluation test is performed on the first front-end circuit 430_1 based on a test control signal Test_CS6 by using more transmission/reception chains (520_1 to 520_3) than those of FIG. 12A, a magnitude of the test output signal TS_OUT' output through the first to third antennas 412_1 to 412_3 may be greater than that of FIG. 12A. Since the magnitude of the test output signal TS_OUT is greater, the noise-resistant characteristic evaluation test may be performed on the first front-end circuit 430_1, and detailed descriptions are provided above with reference to FIG. 8 and are omitted here.

Referring to FIG. 12C, reception paths for performing the characteristic evaluation test on a k-th front-end circuit may be formed in the RF integrated circuit based on the test control signal (S101"). The formed reception paths may pass through the target phase shifter so that the characteristic evaluation test may be performed on the target phase shifter. The shift degree of the at least one target phase shifter in the k-th front-end circuit may be adjusted based on the test control signal (S102"). The target phase shifter may be selected based on the test control signal. The test input signal that has passed through the reception paths may be output as a j-th test output signal (S103"). It may be determined whether the j-th test output signal is the last test output signal (S104"). When the j-th test output signal is not the last test output signal (NO to S104"), j is counted up (S105"), and then, the shift degree of the target phase shifter may be adjusted in operation S102" to output a next test output signal. When the j-th test output signal is the last output signal (YES to S104"), characteristics of the target phase shifter may be evaluated by using magnitudes of the plurality of test output signals that are output while adjusting the shift degree of the target phase shifter (S106").

Whether the target phase shifter is defective may be determined based on a result of the characteristic evaluation of the target phase shifter (S107"). When the target phase shifter is determined to be defective (YES to S107"), the result of determining the target phase shifter to be defective may be used to determine whether the k-th front-end circuit is defective in operation S110 (FIG. 9). For example, when the target phase shifter is defective, it may be determined that the k-th front-end circuit is defective.

When the target phase shifter is not defective (NO to S107"), it may be determined whether the target phase shifter is the last target phase shifter in the k-th front-end circuit (S108"). When the target phase shifter is not the last target phase shifter in the selected transmission/reception chains (NO to S108"), a next target phase shifter may be selected in the k-th front-end circuit (S109"). The next target phase shifter may be selected based on the test control signal. Returning back to operation S101", reception paths passing through the next target phase shifter are formed to perform the characteristic evaluation test on the next target phase shifter, and then, the characteristic evaluation test may be performed by using the reception paths.

Figure 13A:
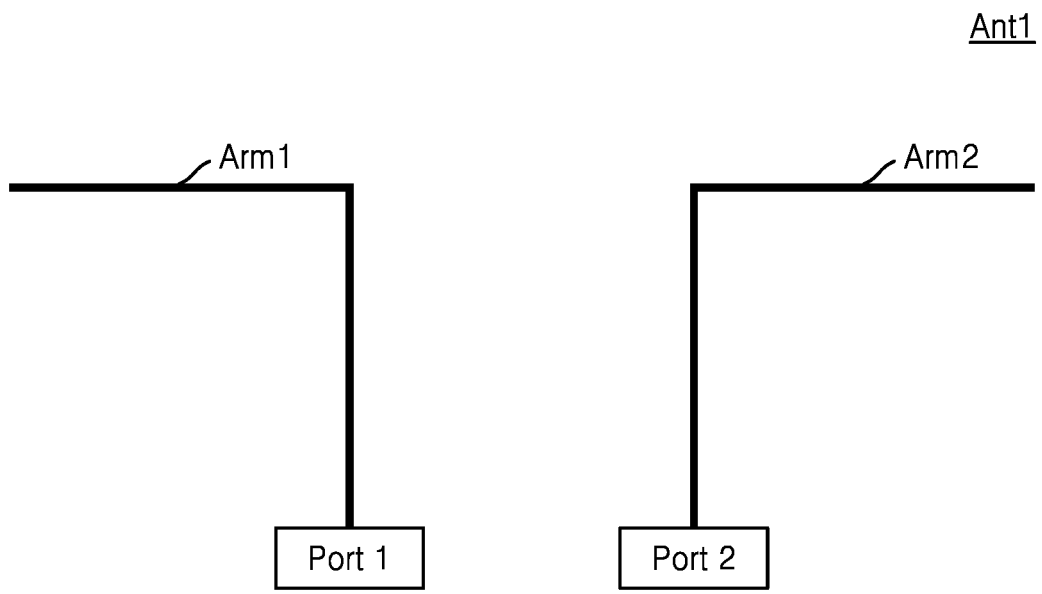
FIGS. 13A to 13C are diagrams for describing types of antennas connected to an RF integrated circuit according to an embodiment.
Figure 13B:
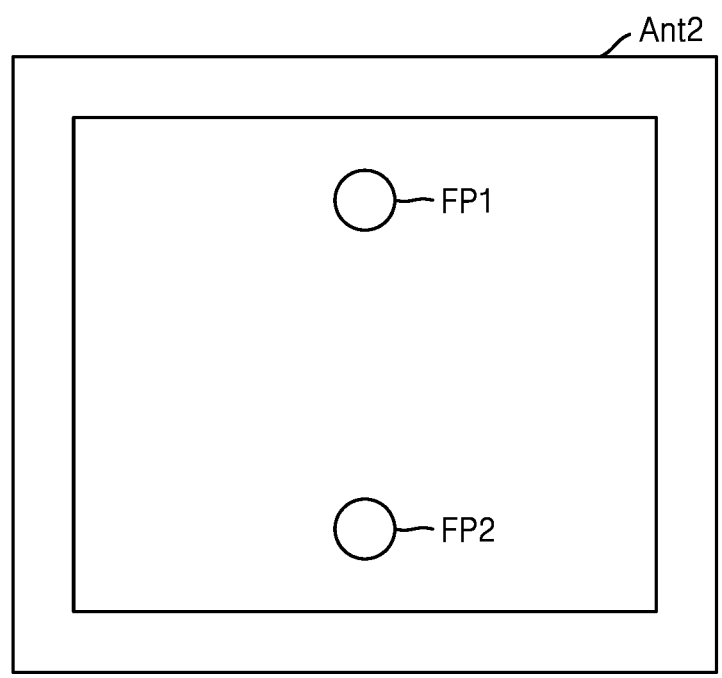
Figure 13C:
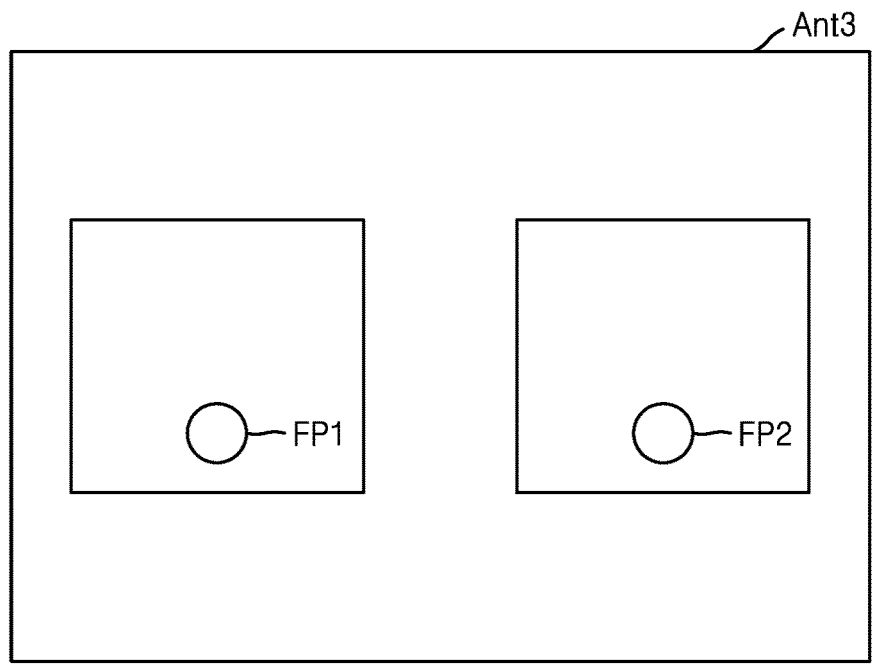

FIGS. 13A to 13C are diagrams for describing kinds of antennas connected to an RF integrated circuit according to an embodiment.

Referring to FIGS. 11A and 13A, a double-input dipole antenna Ant1 may be connected to the first front-end circuit 430_1. As an example, the first transmission/reception chain 520_1 may include a first port Port1 and is connected to a first arm Arm1 of the double-input dipole antenna Ant1 via the first port Port1, and the second transmission/reception chain 520_2 may include a second port Port2 and may be connected to a second arm Arm2 of the double-input dipole antenna Ant1 via the second port Port2. In the above manner, a plurality of double-input dipole antennas may be connected to the RF integrated circuit. When a signal radiated from the double-input dipole antenna Ant1 is measured by using an additional antenna, a signal of a maximum magnitude may be detected when signals radiated respectively from the first and second arms Arm1 and Arm2 have a phase difference of 180. That is, an antenna beam varies depending on the phase difference between the signals radiated through the double-input dipole antenna Ant1, and thus, a magnitude of the beam may vary. By using the above characteristic, the characteristic evaluation test may be performed on the RF integrated circuit illustrated with reference to FIGS. 11A to 11C.

Referring to FIGS. 11A and 13B, a differential feeding patch antenna Ant2 may be connected to the first front-end circuit 430_1. As an example, the first transmission/reception chain 520_1 may be connected to a first feeding point FP1 and the second transmission/reception chain 520_2 may be connected to a second feeding point FP2. An antenna beam varies depending on the phase difference between the signals radiated through the differential feeding patch antenna Ant2, and thus, a magnitude of the beam may vary. By using the above characteristic, the characteristic evaluation test may be performed on the RF integrated circuit illustrated with reference to FIGS. 11A to 11C.

Referring to FIGS. 11A and 13C, a 1×2 patch antenna Ant3 may be connected to the first front-end circuit 430_1. As an example, the first transmission/reception chain 520_1 may be connected to a first feeding point FP1 and the second transmission/reception chain 520_2 may be connected to a second feeding point FP2. The second transmission/reception chain 520_2 may be connected to the second feeding point FP2. An antenna beam varies depending on the phase difference between the signals radiated through the 1×2 patch antenna Ant3, and thus, a magnitude of the beam may vary. By using the above characteristic, the characteristic evaluation test may be performed on the RF integrated circuit illustrated with reference to FIGS. 11A to 11C.

Figure 14:
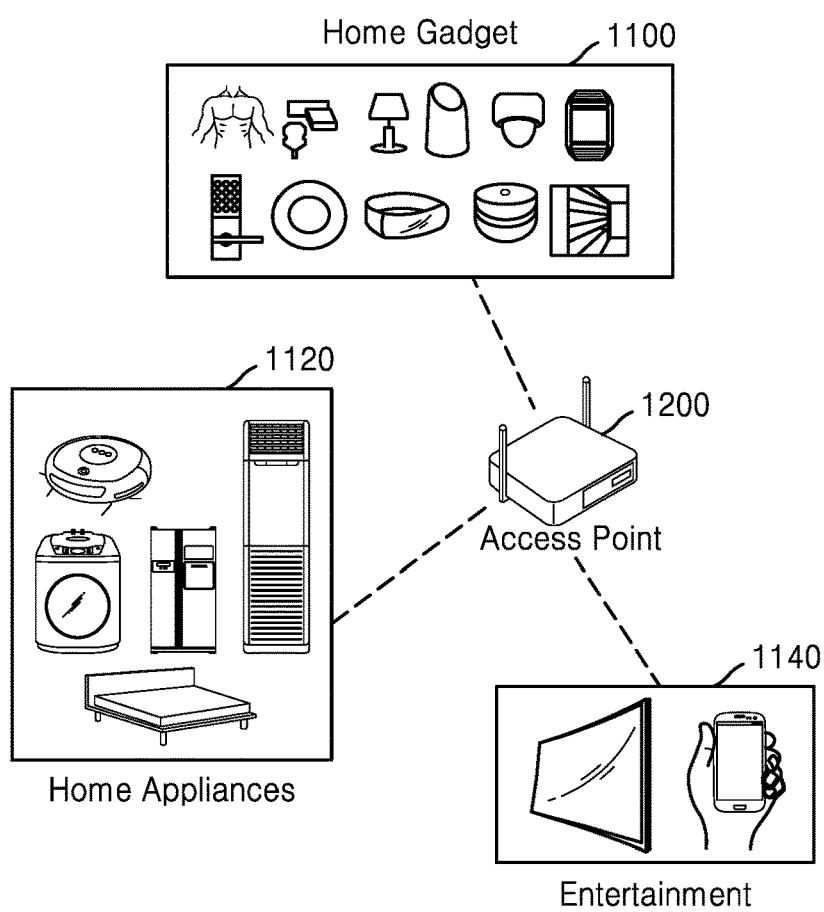
FIG. 14 is a diagram of communication devices including an RF integrated circuit that is produced after being determined to be normal through a characteristic evaluation test according to an embodiment.

FIG. 14 is a diagram of communication devices including an RF integrated circuit that is produced after being determined to be normal through a characteristic evaluation test according to an embodiment.

Referring to FIG. 14, home gadgets 1100, home appliances 1120, entertainment devices 1140, and an access point (AP) 1200 may each include the RF integrated circuit that is produced after being determined to be normal through the characteristic evaluation test according to the embodiment, and may perform communication via the RF integrated circuit. In some embodiments, the home gadgets 1100, the home appliances 1120, the entertainment devices 1140, and the AP 1200 may configure an Internet of Thing (IoT) network system. One of ordinary skill in the art would appreciate that the communication devices shown in FIG. 14 are merely examples, and other communication devices that are not shown in FIG. 14 may include the RF integrated circuit that passes the characteristic evaluation test according to the embodiment.

While the inventive concept has been particularly shown and described with reference to embodiments thereof, it will be understood that various changes in form and details may be made therein without departing from the spirit and scope of the following claims.

What is claimed is:

1. A method of testing a radio frequency (RF) integrated circuit comprising a first front-end circuit including a plurality of switching devices, a second front-end circuit including a plurality of switching devices, a first transceiver circuit connected to the first front-end circuit to transmit/receive signals, a second transceiver circuit connected to the second front-end circuit to transmit/receive signals, and a switching circuit configured to selectively connect the first and second front-end circuits to the first and second transceiver circuits, the method comprising:

forming, performed by the RF integrated circuit, a test loop that passes through the first transceiver circuit, the first front-end circuit, and the second transceiver circuit, based on a test control signal transmitted from a test device;

adjusting, performed by the RF integrated circuit, a shift degree of at least one phase shifter in the first front-end circuit, based on the test control signal;

receiving, performed by the RF integrated circuit, a test input signal via the first transceiver circuit from the test device, and outputting, to the test device, the test input signal that has passed through the test loop, wherein the test input signal is output as a test output signal via the second transceiver circuit; and evaluating, performed by the test device, characteristics of the at least one phase shifter based on the test output signal.

2. The method of claim 1, wherein the test loop comprises test sub-loops formed in at least two transmission/reception chains selected from among a plurality of transmission/reception chains in the first front-end circuit.

3. The method of claim 2, wherein the forming the test loop further comprises connecting, performed by the RF integrated circuit, a transmission chain and a reception chain included in each of the at least two selected transmission/reception chains to each other via the switching device.

4. The method of claim 1, wherein the test loop comprises a first loop path in the first transceiver circuit for amplifying and up-converting a frequency of the test input signal, a second loop path in the first transceiver circuit for amplifying and down-converting the frequency of the test input signal that has passed through the first front-end circuit, and a third loop path in the second transceiver circuit for outputting the test input signal that has passed through the second loop path to the test device.

5. The method of claim 4, wherein the switching circuit comprises a connection circuit configured to selectively connect the second loop path to the third loop path based on the test control signal.

6. The method of claim 1, wherein the adjusting the shift degree comprises:
adjusting a shift degree of at least one target phase shifter that is a target of the testing in the first front-end circuit; and
fixing shift degrees of phase shifters other than the at least one target phase shifter in the first front-end circuit.

7. The method of claim 6, wherein each of the at least one target phase shifter is a phase shifter included in a transmission chain or a reception chain in one of a plurality of transmission/reception chains in the first front-end circuit.

8. The method of claim 1, wherein the outputting the test output signal to the test device comprises:
up-converting the test input signal by using the first transceiver circuit; and
down-converting the test input signal that has passed through the test loop by using the first transceiver circuit.

9. The method of claim 1, wherein the test input signal and the test output signal have a frequency corresponding to a base band or an intermediate frequency band.

10. The method of claim 1, wherein the RF integrated circuit is configured to repeatedly perform an operation of receiving the test input signal from the test device and outputting the test output signal to the test device whenever the shift degree of the at least one phase shifter is adjusted.

11. The method of claim 10, wherein the evaluating the characteristics of the at least one phase shifter is performed by using magnitudes of a plurality of test output signals, including the test output signal, received from the RF integrated circuit.

12. The method of claim 11, wherein the evaluating the characteristics of the at least one phase shifter comprises:
comparing a difference between a maximum magnitude and a minimum magnitude from among the magnitudes of the test output signals with a critical value; and
determining whether the at least one phase shifter is defective based on a result of the comparing.

13. A method of testing a radio frequency (RF) integrated circuit comprising a front-end circuit including a plurality of transmission/reception chains, the method comprising:
forming, performed by the RF integrated circuit, a test loop in at least two transmission/reception chains selected from among the plurality of transmission/reception chains, based on a test control signal received from a test device;
adjusting, performed by the RF integrated circuit, a shift degree of at least one phase shifter included in the selected transmission/reception chains based on the test control signal;
receiving, performed by the RF integrated circuit, a test input signal from the test device, and outputting, to the test device, the test input signal, that has passed through the test loop, as a test output signal; and
evaluating, performed by the test device, characteristics of the at least one phase shifter based on the test output signal,
wherein the test device comprises a first test device and a second test device, wherein the test control signal is received from the first test device, and the test output signal is output to the first test device for the evaluating the characteristics of the at least one phase shifter,
wherein the test input signal is received from the second test device via a plurality of antennas respectively connected to the plurality of transmission/reception chains.

14. The method of claim 13, wherein the RF integrated circuit is connected to the plurality of antennas comprising differential feeding antennas or array antennas through which the test input signal is received or the test output signal is output.

15. The method of claim 13, wherein the RF integrated circuit is configured to repeatedly perform an operation of receiving the test input signal from the test device and transmitting the test output signal to the test device whenever the shift degree of the at least one phase shifter is adjusted.

16. The method of claim 15, wherein the evaluating the characteristics of the at least one phase shifter is performed by determining magnitudes of a plurality of test output signals, including the test output signal, received from the RF integrated circuit via the plurality of antennas respectively connected to the plurality of transmission/reception chains.

17. The method of claim 13,
wherein the test input signal and the test control signal are received from the first test device, and the test output signal is output to the second test device for the evaluating the characteristics of the at least one phase shifter via the plurality of antennas respectively connected to the plurality of transmission/reception chains.

18. A method of testing a radio frequency (RF) integrated circuit, the method comprising performing a test loop operation a plurality of times by using a test loop that passes through a first transceiver circuit, a first front-end circuit, and a second transceiver circuit in the RF integrated circuit,
wherein the test loop operation comprises:
receiving, performed by the RF integrated circuit, an n-th phase control signal from a test device and adjusting a shift degree of at least one phase shifter in the first front-end circuit to an n-th state; and
receiving, performed by the RF integrated circuit, a test input signal from the test device via the first transceiver circuit, and outputting, to the test device, the test input signal that has passed through the test loop, wherein the test input signal is output as an n-th test output signal via the second transceiver circuit,
wherein the test device determines whether the at least one phase shifter is defective by using magnitudes of a plurality of test output signals including the n-th test output signal collected as results of the test loop operation performed a plurality of times, and
wherein n is an integer greater than zero.

19. The method of claim 18, wherein the first transceiver circuit is dedicated as a circuit for transmitting/receiving signals to/from the first front-end circuit, and the second transceiver circuit is dedicated as a circuit for transmitting/receiving signals to/from a second front-end circuit in the RF integrated circuit, wherein the second front-end circuit is different from the first front-end circuit.

* * * * *